(12) United States Patent
Oh et al.

(10) Patent No.: US 10,886,927 B2
(45) Date of Patent: Jan. 5, 2021

(54) SIGNAL GENERATION CIRCUIT SYNCHRONIZED WITH A CLOCK SIGNAL AND A SEMICONDUCTOR APPARATUS USING THE SAME

(71) Applicant: SK hynix Inc., Icheon-si (KR)

(72) Inventors: Seung Wook Oh, Yongin-si (KR); Jin Il Chung, Namyangju-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/736,688

(22) Filed: Jan. 7, 2020

(65) Prior Publication Data

US 2020/0228123 A1    Jul. 16, 2020

(30) Foreign Application Priority Data

Jan. 15, 2019 (KR) .................. 10-2019-0005213

(51) Int. Cl.
| | |
|---|---|
| *G06F 1/10* | (2006.01) |
| *H03L 7/081* | (2006.01) |
| *G06F 1/06* | (2006.01) |
| *G06F 1/12* | (2006.01) |
| *H03K 19/20* | (2006.01) |

(52) U.S. Cl.
CPC .............. *H03L 7/0812* (2013.01); *G06F 1/06* (2013.01); *G06F 1/10* (2013.01); *G06F 1/12* (2013.01); *H03K 19/20* (2013.01)

(58) Field of Classification Search
CPC ..... G06F 1/04; G06F 1/06; G06F 1/08; G06F 1/10; G06F 1/12; H03L 7/0812; H03K 19/20

USPC ................................. 327/115, 117, 118, 141
See application file for complete search history.

(56) References Cited

U.S. PATENT DOCUMENTS

| | | | |
|---|---|---|---|
| 5,452,436 A * | 9/1995 | Arai | G06F 1/10 713/375 |
| 7,031,615 B2 | 4/2006 | Gentile | |
| 7,671,622 B2 * | 3/2010 | Oh | H03K 19/0005 326/30 |
| 8,638,110 B2 * | 1/2014 | Lee | G01D 5/24 324/679 |
| 2008/0101524 A1 * | 5/2008 | Jeong | H03D 13/004 375/376 |
| 2011/0148480 A1 * | 6/2011 | Fan | G06F 1/04 327/115 |

(Continued)

FOREIGN PATENT DOCUMENTS

| | | |
|---|---|---|
| KR | 1020150106092 A | 9/2015 |
| KR | 1020170137451 A | 12/2017 |

*Primary Examiner* — Tomi Skibinski
(74) *Attorney, Agent, or Firm* — William Park & Associates Ltd.

(57) ABSTRACT

A signal generation circuit generates a first synchronization signal by delaying a first input signal in synchronization with a first division clock signal, and generates a second synchronization signal by delaying a second input signal in synchronization with a second division clock signal. The signal generation circuit adjusts pulse widths of the first and second synchronization signals based on an on-control signal and an off-control signal. The signal generation circuit includes a retiming circuit configured to generate an output signal by retiming a preliminary output signal, generated from the first and second synchronization signals, based on the first and second division clock signals.

33 Claims, 17 Drawing Sheets

(56) References Cited

U.S. PATENT DOCUMENTS

| | | | |
|---|---|---|---|
| 2011/0193598 A1* | 8/2011 | Bhakta | H03K 3/2885 |
| | | | 327/141 |
| 2015/0222283 A1* | 8/2015 | Wanibuchi | G06F 1/08 |
| | | | 327/115 |
| 2019/0052123 A1* | 2/2019 | Dina | H02M 3/3376 |
| 2019/0333553 A1* | 10/2019 | Choi | G11C 7/222 |

* cited by examiner

FIG.12

| BYPASS | MODE | OSE | OSD | Retimer type |
|--------|------|-----|-----|--------------|
| 0 | 0 | 2 | 1 | AND type |
| 0 | 1 | 1 | 2 | OR type |
| 1 | Don't care | 2 | 2 | Flip-flop type |
| 1 | | | | |

SIGNAL GENERATION CIRCUIT SYNCHRONIZED WITH A CLOCK SIGNAL AND A SEMICONDUCTOR APPARATUS USING THE SAME

CROSS-REFERENCE TO RELATED APPLICATION

The present application claims priority under 35 U.S.C. § 119(a) to Korean application number 10-2019-0005213, filed on Jan. 15, 2019, in the Korean Intellectual Property Office, which is incorporated herein by reference in its entirety.

BACKGROUND

1. Technical Field

Various embodiments generally relate to integrated circuit technology, and more particularly, to a semiconductor apparatus operating in synchronization with a clock signal.

2. Related Art

An electronic device includes many electronic components. A computer system, for example, may include many semiconductor apparatuses configured with semiconductors. The semiconductor apparatuses configuring the computer system may communicate with each other by transmitting and receiving clock signals and data. The semiconductor apparatuses may operate in synchronization with a clock signal. The semiconductor apparatuses may internally generate various signals based on a signal transmitted by an external apparatus. The various signals may be delayed and generated by internal circuits of the semiconductor apparatuses. The delays may include synchronous delays and asynchronous delays. For example, a memory apparatus, such as a dynamic random access memory (DRAM), may generate an internal signal using a synchronous delay with respect to data and clock signals related to the data, and may generate an internal signal using an asynchronous delay with respect to control signals, such as a command signal and an address signal, other than data. However, when data is output, the semiconductor apparatuses need to perform an operation of synchronizing an internal signal, generated using an asynchronous delay, with a clock signal again. Such an operation may be referred to as "domain crossing." As the operating speed of a computer system or semiconductor system increases, the frequency of a clock signal continues to increase. In order to secure a margin necessary to internally process a signal, semiconductor apparatuses generate and use a division clock signal having a low frequency by dividing a clock signal having the high frequency. When a domain crossing operation is performed using a division clock signal, there is a need for a circuit capable of generating a signal having a given delay quantity and a pulse width.

SUMMARY

In an embodiment, a signal generation circuit may include a clock division circuit, a first synchronization signal generation circuit, a second synchronization signal generation circuit, and a retiming circuit. The clock division circuit may be configured to generate a first division clock signal and a second division clock signal by dividing a clock signal. The first synchronization signal generation circuit may be configured to generate a first synchronization signal by delaying a first input signal in synchronization with the first division clock signal and to adjust a pulse width of the first synchronization signal based on an on-control signal and an off-control signal. The second synchronization signal generation circuit may be configured to generate a second synchronization signal by delaying a second input signal in synchronization with the second division clock signal and to adjust a pulse width of the second synchronization signal based on the on-control signal and the off-control signal. The retiming circuit may be configured to generate an output signal by retiming a preliminary output signal based on the first and second division clock signals, wherein the output signal is generated from at least one of the first and second synchronization signals.

In an embodiment, a signal generation circuit may include a clock divider, an on-pulse generation circuit, an off-pulse generation circuit, a pulse sum circuit, and a retiming circuit. The clock divider may be configured to generate a first division clock signal and a second division clock signal by dividing a clock signal. The on-pulse generation circuit may be configured to generate an even on-pulse signal by delaying a first input signal based on the first division clock signal and an on-control signal and to generate an odd on-pulse signal by delaying a second input signal based on the second division clock signal and the on-control signal. The off-pulse generation circuit may be configured to generate a plurality of even off-pulse signals by delaying one of the even on-pulse signal and the odd on-pulse signal based on the first division clock signal and an off-control signal and to generate a plurality of odd off-pulse signals by delaying one of the even on-pulse signal and the odd on-pulse signal based on the second division clock signal and the off-control signal. The pulse sum circuit may be configured to generate a first synchronization signal by combining one of the even on-pulse signal and the odd on-pulse signal with the plurality of even off-pulse signals and to generate a second synchronization signal by combining one of the even on-pulse signal and the odd on-pulse signal with the plurality of odd off-pulse signals. The retiming circuit may be configured to generate an output signal by retiming a preliminary output signal based on the first and second division clock signals, generated from one of the first and second synchronization signals.

BRIEF DESCRIPTION OF THE DRAWINGS

FIG. 12 is a table illustrating retiming latency of the programmable retiming module set in response to a mode signal and a bypass signal.

DETAILED DESCRIPTION

Hereinafter, a signal generation circuit and a semiconductor apparatus is described with reference to the accompanying drawings through various embodiments.

Figure 1:
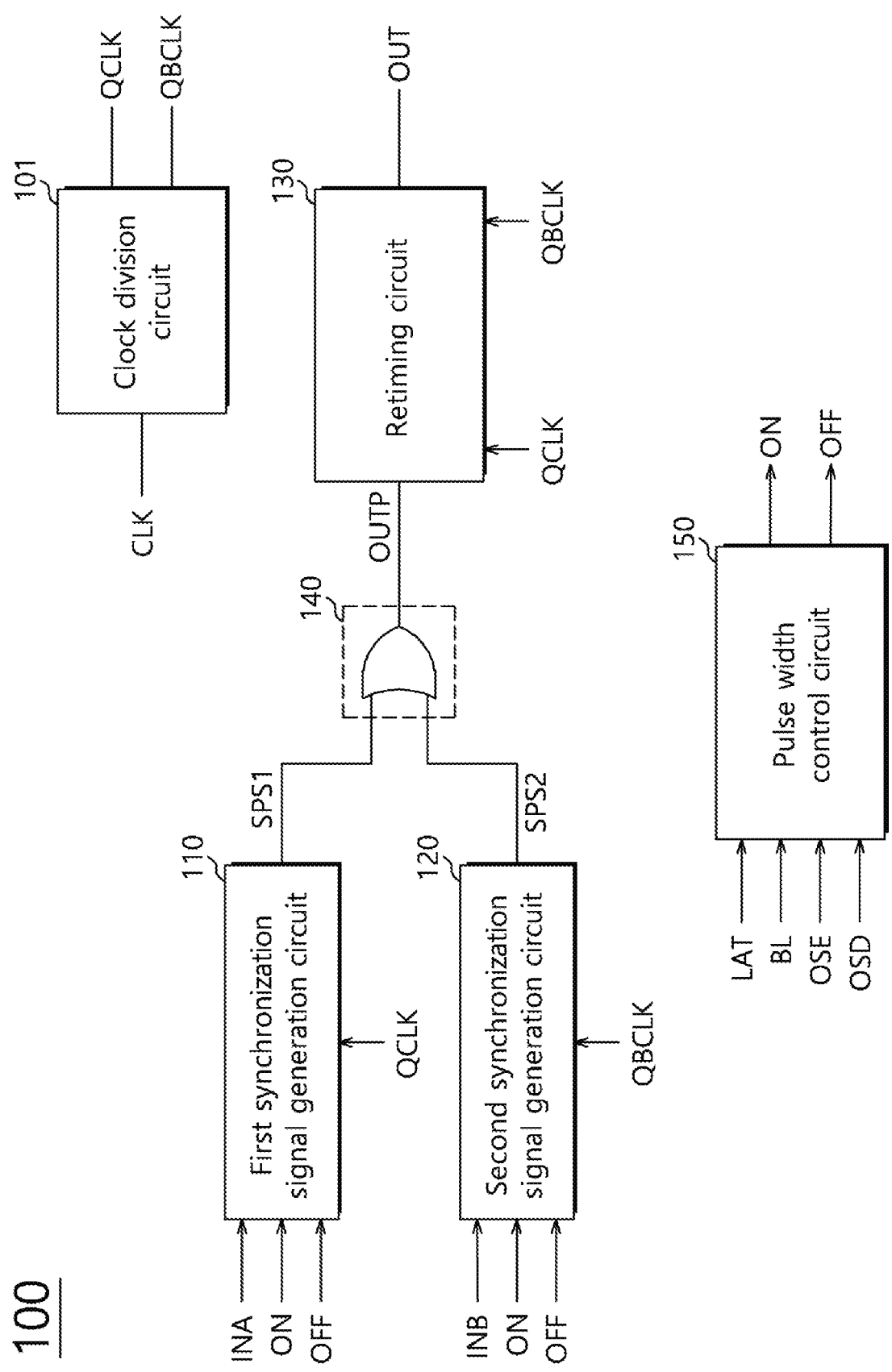
FIG. 1 is a diagram illustrating a configuration of a signal generation circuit according to various embodiments.

FIG. 1 is a diagram illustrating a configuration of a signal generation circuit 100 according to various embodiments. In FIG. 1, the signal generation circuit 100 may receive a first input signal INA and a second input signal INB and generate an output signal OUT. The signal generation circuit 100 may generate the output signal OUT by delaying the first input signal INA in synchronization with a first division clock signal QCLK and delaying the second input signal INB in synchronization with a second division clock signal QBCLK. The first division clock signal QCLK may have a phase different from that of the second division clock signal QBCLK. For example, the first division clock signal QCLK and the second division clock signal QBCLK may have a phase difference of 180 degrees. The signal generation circuit 100 may adjust a delay quantity of each of the first and second input signals INA and INB based on an on-control signal ON and an off-control signal OFF, and may adjust the pulse width of the output signal OUT.

The signal generation circuit 100 may include a clock division circuit 101. The clock division circuit 101 may generate the first and second division clock signals QCLK and QBCLK by dividing the frequency of a clock signal CLK. For example, the clock division circuit 101 may generate the first and second division clock signals QCLK and QBCLK by dividing the frequency of the clock signal CLK into two. The first division clock signal QCLK and the second division clock signal QBCLK may have a phase difference of 180 degrees. For example, the first division clock signal QCLK may have a phase synchronized with an odd-numbered falling edge of the clock signal CLK. The second division clock signal QBCLK may have a phase synchronized with an even-numbered falling edge of the clock signal CLK. The first input signal INA may be generated from a signal received in synchronization with an odd-numbered rising edge of the clock signal CLK. The second input signal INB may be generated from a signal received in synchronization with an even-numbered rising edge of the clock signal CLK. As the operating speeds of a semiconductor apparatus and system increase, the clock signal CLK may have a higher frequency. When the frequency of the clock signal CLK increases, a time margin for sampling or holding a signal may be insufficient because a cycle is shortened and amplitude is reduced. Accordingly, the signal generation circuit 100 can sufficiently secure a time margin for generating the output signal OUT from the first and second input signals INA and INB by generating the first and second division clock signals QCLK and QBCLK from the clock signal CLK and generating the output signal OUT using the first and second division clock signals QCLK and QBCLK.

The signal generation circuit 100 may include a first synchronization signal generation circuit 110, a second synchronization signal generation circuit 120, and a retiming circuit 130. The first synchronization signal generation circuit 110 may receive the first input signal INA, the first division clock signal QCLK, the on-control signal ON, and the off-control signal OFF, and may generate a first synchronization signal SPS1. The first synchronization signal generation circuit 110 may generate the first synchronization signal SPS1 by delaying the first input signal INA in synchronization with the first division clock signal QCLK, and may adjust the pulse width of the first synchronization signal SPS1 based on the on-control signal ON and the off-control signal OFF.

The first synchronization signal generation circuit 110 may generate an even on-pulse signal ONA (refer to FIG. 2) by delaying the first input signal INA by n cycles of the first division clock signal QCLK. In an embodiment, n represents a natural number. The first synchronization signal generation circuit 110 may determine enabling timing of the first synchronization signal SPS1 based on the even on-pulse signal ONA. The n may be determined based on the on-control signal ON. The n may be a value corresponding to information of the on-control signal ON. The first synchronization signal generation circuit 110 may generate an even off-pulse signal OFFA (refer to FIG. 2) by delaying the even on-pulse signal ONA by m cycles of the first division clock signal. In an embodiment, m represents a natural number. The first synchronization signal generation circuit 110 may determine disabling timing of the first synchronization signal SPS1 based on the even off-pulse signal OFFA. The m may be determined based on the off-control signal OFF. The m may be a value corresponding to information of the off-control signal OFF.

The second synchronization signal generation circuit 120 may receive the second input signal INB, the second division clock signal QBCLK, the on-control signal ON, and the off-control signal OFF, and may generate a second synchronization signal SPS2. The second synchronization signal generation circuit 120 may generate the second synchronization signal SPS2 by delaying the second input signal INB in synchronization with the second division clock signal QBCLK, and may adjust the pulse width of the second synchronization signal SPS2 based on the on-control signal ON and the off-control signal OFF.

The second synchronization signal generation circuit 120 may generate an odd on-pulse signal ONB (refer to FIG. 2) by delaying the second input signal INB by n cycles of the second division clock signal QBCLK. The second synchronization signal generation circuit 120 may determine enabling timing of the second synchronization signal SPS2 based on the odd on-pulse signal ONB. The second synchronization signal generation circuit 120 may generate an odd off-pulse signal OFFB (refer to FIG. 2) by delaying the odd on-pulse signal ONB by m cycles of the second division clock signal QBCLK. The second synchronization signal generation circuit 120 may determine disabling timing of the second synchronization signal SPS2 based on the odd off-pulse signal OFFB.

The retiming circuit 130 may receive a preliminary output signal OUTP generated from one of the first and second synchronization signals SPS1 and SPS2. The signal generation circuit 100 may further include a gating circuit 140 for receiving the first and second synchronization signals SPS1 and SPS2 and generating the preliminary output signal OUTP. The gating circuit 140 may output the first synchronization signal SPS1 or the second synchronization signal SPS2 as the preliminary output signal OUTP. For example, the gating circuit 140 may include an OR gate. The retiming circuit 130 may receive the first and second division clock signals QCLK and QBCLK. The retiming circuit 130 may generate the output signal OUT by retiming the preliminary output signal OUTP based on the first and second division clock signals QCLK and QBCLK. The retiming circuit 130 may generate the output signal OUT by delaying the preliminary output signal OUTP in synchronization with each of the first and second division clock signals QCLK and QBCLK and combining the delayed signals.

The signal generation circuit 100 uses clock signals having two different phases. Accordingly, the retiming circuit 130 cannot perform a retiming operation using only any one of the first and second division clock signals QCLK and QBCLK. For example, if the retiming circuit 130 retimes the preliminary output signal OUTP, generated from the first synchronization signal SPS1, based on the second division clock signal QBCLK or retimes the preliminary output signal OUTP, generated from the second synchronization signal SPS2, based on the first division clock signal QCLK, it is difficult to guarantee a given pulse width of the output signal OUT. The retiming circuit 130 can generate the output signal OUT having a pulse width of a given range because it performs a retiming operation on the preliminary output signal OUTP using both the first and second division clock signals QCLK and QBCLK regardless of from which one of the first and second synchronization signals SPS1 and SPS2 the preliminary output signal OUTP has been generated.

The signal generation circuit 100 may further include a pulse width control circuit 150. The pulse width control circuit 150 may generate the on-control signal ON and the off-control signal OFF based on operation information of a semiconductor apparatus including the signal generation circuit 100 and operation information of the retiming circuit 130. The operation information of the semiconductor apparatus may include information for determining enabling timing and disabling timing of the output signal OUT and determining a pulse width of the output signal OUT. The operation information of the semiconductor apparatus may include operation latency LAT and operation section information BL. For example, the operation latency LAT may be time information, such as column address strobe (CAS) latency or read latency. The operation section information BL may be time information, such as a burst length. For example, after the first and second input signals INA and INB are input, the signal generation circuit 100 may enable the output signal OUT after a cycle of a clock signal corresponding to the operation latency LAT and may disable the output signal OUT after a cycle of a clock signal corresponding to the operation section information BL.

The operation information of the retiming circuit 130 may be retiming latency. The operation information or retiming latency of the retiming circuit may correspond to a latency time generated when the retiming circuit 130 retimes the preliminary output signal OUTP based on the first and second division clock signals QCLK and QBCLK. The retiming latency may include an on-offset signal OSE and an off-offset signal OSD. The pulse width control circuit 150 may generate the on-control signal ON for determining enabling timing of the output signal OUT based on the operation latency LAT and the on-offset signal OSE. The pulse width control circuit 150 may generate the off-control signal OFF for determining disabling timing of the output signal OUT based on the operation section information BL and the off-offset signal OSD.

Figure 2:
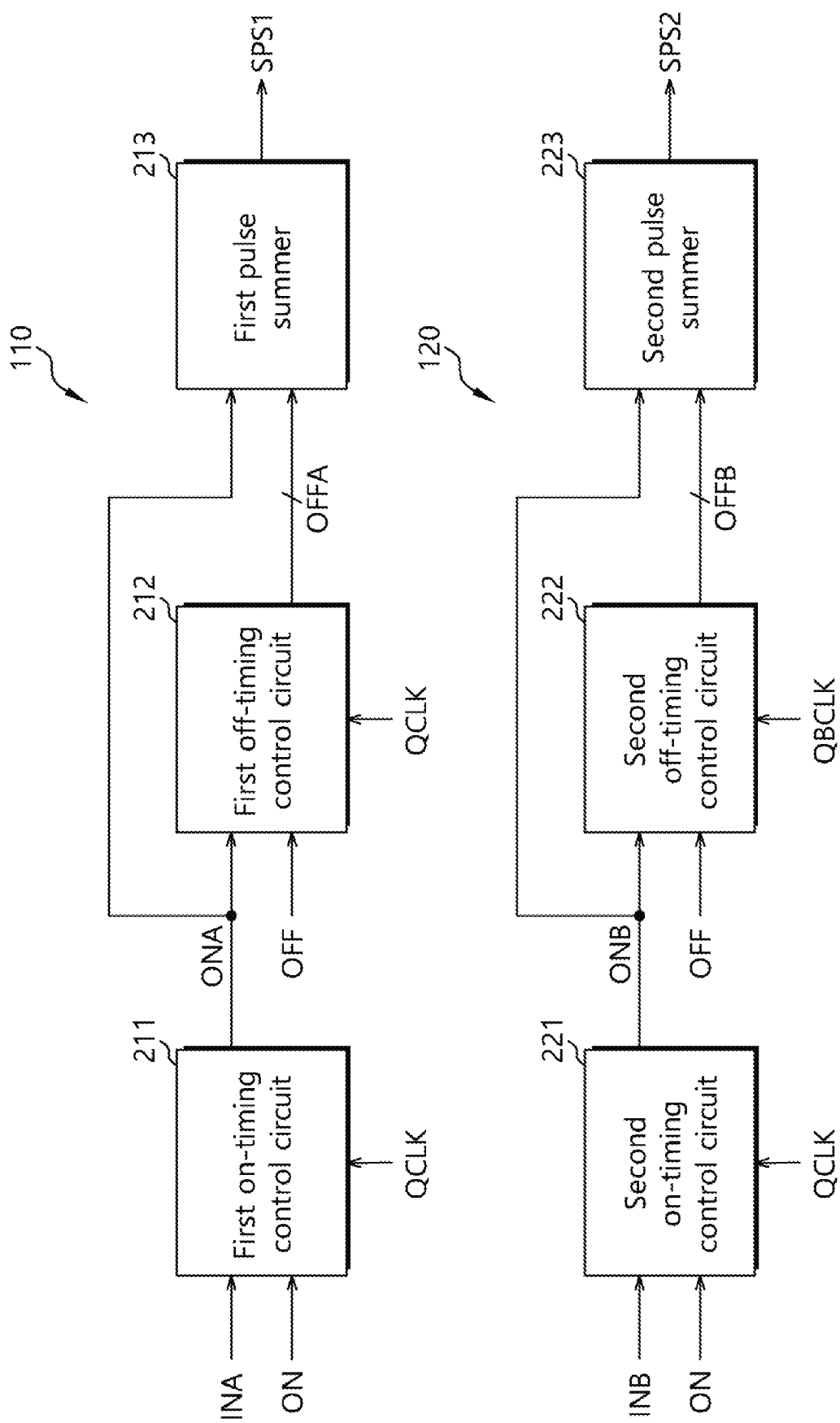
FIG. 2 is a diagram illustrating configurations of a first synchronization signal generation circuit and second synchronization signal generation circuit illustrated in FIG. 1.

FIG. 2 is a diagram illustrating the configurations of the first synchronization signal generation circuit 110 and second synchronization signal generation circuit 120 illustrated in FIG. 1. In FIG. 2, the first synchronization signal generation circuit 110 may include a first on-timing control circuit 211, a first off-timing control circuit 212, and a first pulse summer 213. The first on-timing control circuit 211 may receive the first input signal INA, the first division clock signal QCLK, and the on-control signal ON and generate the even on-pulse signal ONA. The first on-timing control circuit 211 may generate the even on-pulse signal ONA by delaying the first input signal INA by a time corresponding to the on-control signal ON in synchronization with the first division clock signal QCLK. The first on-timing control circuit 211 may generate the even on-pulse signal ONA by delaying the first input signal INA by n cycles of the first division clock signal QCLK. The n may be an integer of 2 or more and may be determined based on the on-control signal ON.

The first off-timing control circuit 212 may receive the even on-pulse signal ONA, the first division clock signal QCLK, and the off-control signal OFF. The first off-timing control circuit 212 may generate the even off-pulse signal OFFA by delaying the even on-pulse signal ONA by a time corresponding to the off-control signal OFF in synchronization with the first division clock signal QCLK. The first off-timing control circuit 212 may generate the even off-pulse signal OFFA by delaying the even on-pulse signal ONA by m cycles of the first division clock signal QCLK. The m may be determined based on the off-control signal OFF.

The first pulse summer 213 may receive the even on-pulse signal ONA and the even off-pulse signal OFFA and output the first synchronization signal SPS1. The first pulse summer 213 may enable the first synchronization signal SPS1 based on the even on-pulse signal ONA, and may disable the first synchronization signal SPS1 based on the even off-pulse signal OFFA. In one embodiment, the first pulse summer 213 may generate the first synchronization signal SPS1 by adding the even on-pulse signal ONA and the m even off-pulse signals OFFA.

The second synchronization signal generation circuit 120 may include a second on-timing control circuit 221, a second off-timing control circuit 222, and a second pulse summer 223. The second on-timing control circuit 221 may receive the second input signal INB, the second division clock signal QBCLK, and the on-control signal ON, and may generate the odd on-pulse signal ONB. The second on-timing control circuit 221 may generate the odd on-pulse signal ONB by delaying the second input signal INB by a time corresponding to the on-control signal ON in synchronization with the second division clock signal QBCLK. The second on-timing control circuit 221 may generate the odd on-pulse signal ONB by delaying the second input signal INB by n cycles of the second division clock signal QBCLK.

The second off-timing control circuit 222 may receive the odd on-pulse signal ONB, the second division clock signal QBCLK, and the off-control signal OFF. The second off-timing control circuit 222 may generate the odd off-pulse signal OFFB by delaying the odd on-pulse signal ONB by a time corresponding to the off-control signal OFF in synchronization with the second division clock signal QBCLK. The second off-timing control circuit 222 may generate the odd off-pulse signal OFFB by delaying the odd on-pulse signal ONB by m cycles of the second division clock signal QBCLK. The m may be determined based on the off-control signal OFF.

The second pulse summer 223 may receive the odd on-pulse signal ONB and the odd off-pulse signal OFFB and output the second synchronization signal SPS2. The second pulse summer 223 may enable the second synchronization signal SPS2 based on the odd on-pulse signal ONB, and may disable the second synchronization signal SPS2 based on the odd off-pulse signal OFFB. In one embodiment, the second pulse summer 223 may generate the second synchronization signal SPS2 by adding the odd on-pulse signal ONB and the m odd off-pulse signals OFFB.

Figure 3:
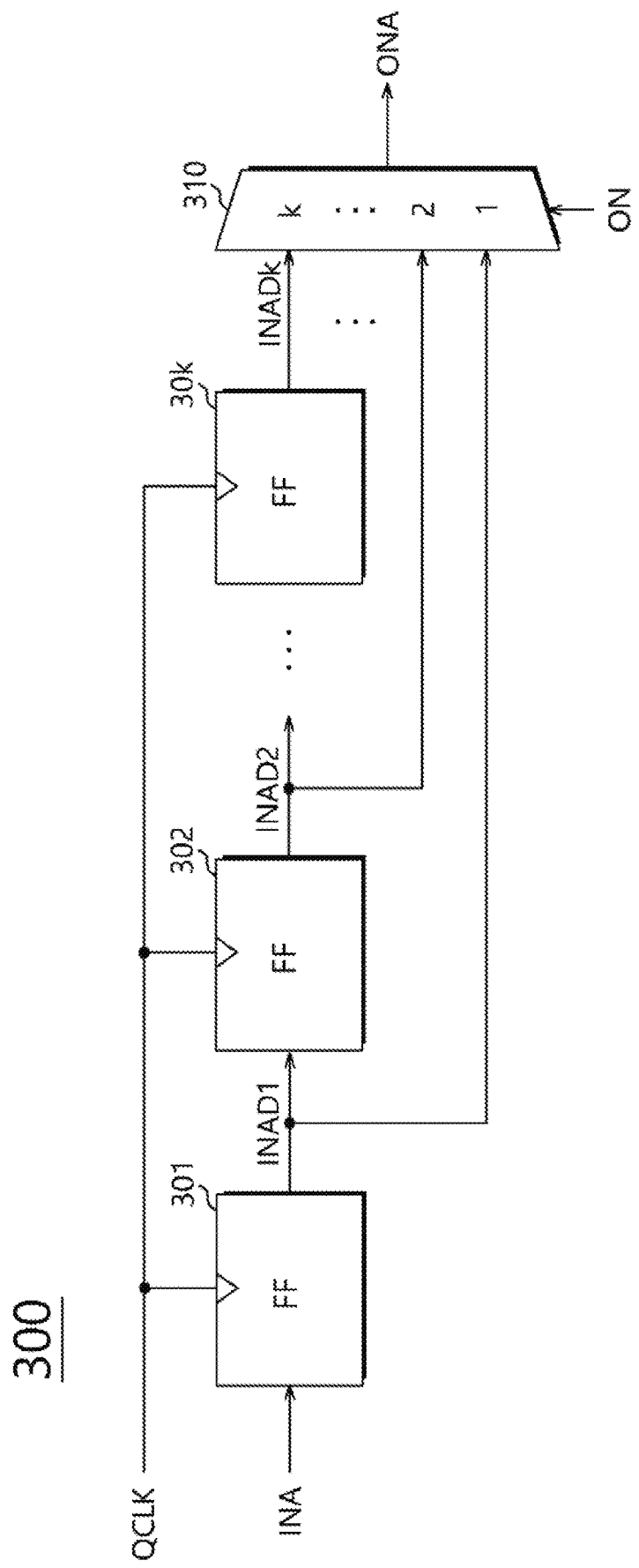
FIG. 3 is a diagram illustrating a configuration of a first on-timing control circuit according to various embodiments.

FIG. 3 is a diagram illustrating a configuration of a first on-timing control circuit 300 according to various embodiments. The first on-timing control circuit 300 may be applied as the first on-timing control circuit 211 illustrated in FIG. 2. In FIG. 3, the first on-timing control circuit 300 may include a plurality of flip-flops (FFs) 301, 302, ..., and 30k and a multiplexer 310. The plurality of FFs may be electrically coupled in series in a chain structure. The first FF 301 may receive the first input signal INA and the first division clock signal QCLK, and may output a first delay input signal INAD1 by synchronizing the first input signal INA with the first division clock signal QCLK. The second FF 302 may receive the first delay input signal INAD1 and the first division clock signal QCLK, and may output a second delay input signal INAD2 by synchronizing the first delay input signal INAD1 with the first division clock signal QCLK. The second delay input signal INAD2 may be input to the FF of a next stage electrically coupled to the second FF 302. The k-th FF 30k may receive a delay input signal output by the FF of a previous stage, and may output a k-th delay input signal INADk by synchronizing the delay input signal with the first division clock signal QCLK. The k may be a given integer greater than n. The multiplexer 310 may receive signals, output by the plurality of FFs 301, 302, ..., and 30k, respectively, and the on-control signal ON. The multiplexer 310 may output one of the first to k-th delay input signals INAD1, INAD2, ..., and INDk, output by the plurality of FFs, as the even on-pulse signal ONA based on the on-control signal ON. If the first on-timing control circuit 300 is configured with a plurality of FFs as illustrated in FIG. 3, each of the first to k-th delay input signals INAD1, INAD2, ..., and INADk may have a phase difference corresponding to one cycle of the first division clock signal QCLK. The second on-timing control circuit 221 illustrated in FIG. 2 may have the same structure as the first on-timing control circuit 300 except an input signal and an output signal.

Figure 4:
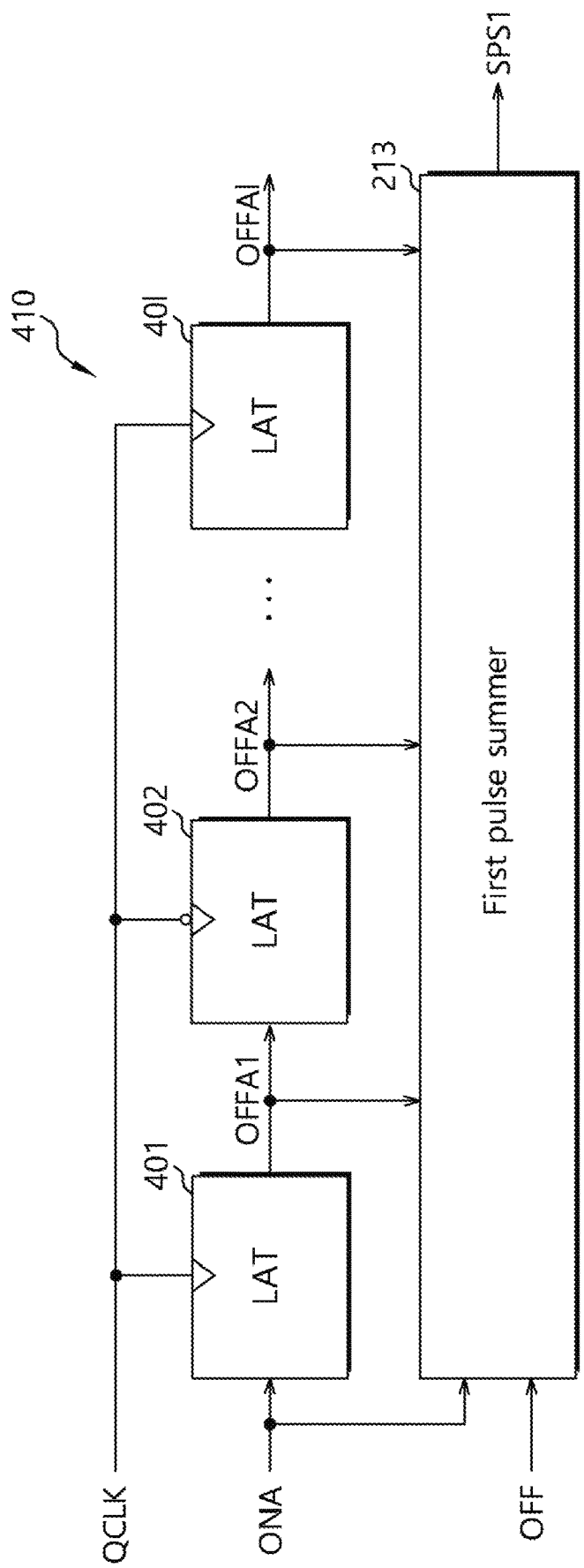
FIG. 4 is a diagram illustrating a configuration of a first off-timing control circuit according to various embodiments.

FIG. 4 is a diagram illustrating a coupling relation between a first off-timing control circuit 410 and the first pulse summer 213 illustrated in FIG. 2 according to various embodiments. The first off-timing control circuit 410 may be applied as the first off-timing control circuit 212 illustrated in FIG. 2. The first off-timing control circuit 410 may include a plurality of latch circuits (LATs) 401, 402, ..., and 40I. The plurality of LATs may be electrically coupled in series in a chain structure. The plurality of LATs may receive the first division clock signal QCLK in common. An odd-numbered LAT of the plurality of LATs may operate in synchronization with the first division clock signal QCLK. An even-numbered LAT of the plurality of LATs may operate in synchronization with the inverted signal of the first division clock signal QCLK. The first LAT 401 may receive the even on-pulse signal ONA, and may output a first even off-pulse signal OFFA1 by synchronizing the even on-pulse signal ONA with the first division clock signal QCLK. The second LAT 402 may receive the first even off-pulse signal OFFA1, and may output a second even off-pulse signal OFFA2 by synchronizing the first even off-pulse signal OFFA1 the inverted signal of the first division clock signal QCLK. The second even off-pulse signal OFFA2 may be input to the LAT of a next stage of the second LAT 402. The I-th LAT 40I may receive an even off-pulse signal output by the LAT of a previous stage, and may output an I-th even off-pulse signal OFFAI by synchronizing the even off-pulse signal with the first division clock signal QCLK.

The first pulse summer 213 may receive the first to I-th even off-pulse signals OFFA1, OFFA2, and OFFAI, the even on-pulse signal ONA and the off-control signal OFF. The first pulse summer 213 may output the first synchronization signal SPS1 by adding an off pulse signal, having a number corresponding to the off-control signal OFF, among the first to l-th even off-pulse signals OFFA1, OFFA2, and OFFAI, and the even on-pulse signal ONA. For example, when the off-control signal OFF is information corresponding to two cycles of the first division clock signal QCLK, the first pulse summer 213 may generate the first synchronization signal SPS1 by adding the even on-pulse signal ONA, the first even off-pulse signal OFFA1, and the second even off-pulse signal OFFA2. Accordingly, the first synchronization signal SPS1 may be enabled when the even on-pulse signal ONA is enabled, and may be disabled when the second even off-pulse signal OFFA2 is disabled. If the first off-timing control circuit 410 is configured with a plurality of LATs configured to alternately receive the first division clock signal QCLK or the inverted signal as illustrated in FIG. 4, each of the first to k-th delay input signals INAD1, INAD2, and INADk may have a phase difference corresponding to one cycle of the clock signal CLK.

The first off-timing control circuit 410 may be implemented using a plurality of FFs and a multiplexer like the first on-timing control circuit 300 illustrated in FIG. 3. In this case, the first pulse summer 213 may receive the even on-pulse signal ONA and only an off pulse signal having a sequence corresponding to the off-control signal OFF, and may be implemented operate in an SR latch manner. For example, when the off-control signal OFF is information corresponding to two cycles of the first division clock signal QCLK, the first pulse summer 213 may enable the first synchronization signal SPS1 in synchronization with a rising edge of the even on-pulse signal ONA, and may disable the first synchronization signal SPS1 in synchronization with a falling edge of the second even off-pulse signal OFFA2. The second off-timing control circuit 222 illustrated in FIG. 2 may have the same structure as the first off-timing control circuit 410 except an input signal and an output signal.

Figure 5:
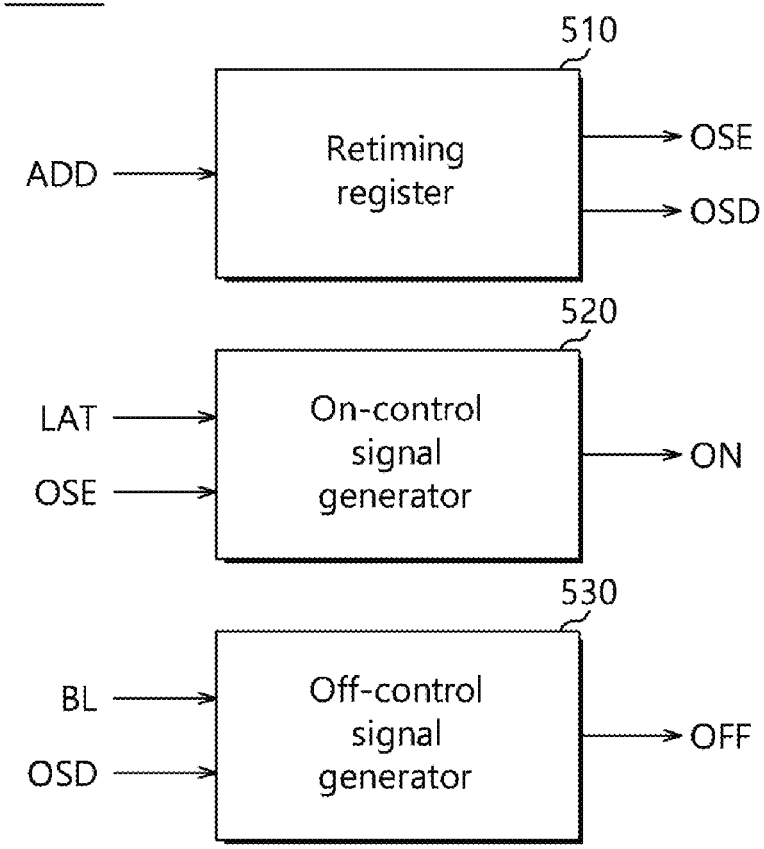
FIG. 5 is a diagram illustrating a configuration of a pulse width control circuit according to various embodiments.

FIG. 5 is a diagram illustrating a configuration of a pulse width control circuit 500 according to various embodiments. The pulse width control circuit 500 may be applied as the pulse width control circuit 150 illustrated in FIG. 1. In FIG. 5, the pulse width control circuit 150 may include a retiming register 510, an on-control signal generator 520, and an off-control signal generator 530. The retiming register 510 may store information of various types of retiming latency according to a characteristic or structure of the retiming circuit 130. The retiming register 510 may output an on-offset signal OSE and off-offset signal OSD corresponding to the retiming latency. The retiming register 510 may receive an address signal ADD, for example, and may output the on-offset signal OSE and off-offset signal OSD corresponding to specific retiming latency based on the address signal ADD.

The on-control signal generator 520 may receive the operation latency LAT and the on-offset signal OSE and generate the on-control signal ON. The on-control signal generator 520 may generate the on-control signal ON by performing an operation on the operation latency LAT and the on-offset signal OSE. For example, the on-control signal generator 520 may generate the on-control signal ON by subtracting the on-offset signal OSE from the operation latency LAT. For example, when the operation latency LAT corresponds to 3 and the on-offset signal OSE corresponds to 1, the on-control signal generator 520 may generate the on-control signal ON corresponding to 2. In the detailed description, integers described as values of latency may have units of time. The unit time may be a time corresponding to one cycle of the clock signal CLK. For example, if the operation latency is 3, this may mean a time corresponding to three cycles of the clock signal CLK. The first on-timing control circuit 211 may generate the even on-pulse signal ONA by delaying the first input signal INA by two cycles of the clock signal CLK (i.e., by one cycle of the first division clock signal QCLK) based on the on-control signal ON.

The off-control signal generator 530 may receive the operation section information BL and the off-offset signal OSD, and may generate the off-control signal OFF. The off-control signal generator 530 may generate the off-control signal OFF by performing an operation on the operation section information BL and the off-offset signal OSD. For example, the off-control signal generator 530 may generate the off-control signal OFF by subtracting the off-offset signal OSD from the operation section information BL. For example, when the operation section information BL corresponds to 8 and the off-offset signal OSD corresponds to 2, the off-control signal generator 530 may generate the off-control signal OFF corresponding to 6. The first off-timing control circuit 212 may generate the even off-pulse signal OFFA by delaying the even on-pulse signal ONA by six cycles of the clock signal CLK (i.e., by three cycles of the first division clock signal) based on the off-control signal OFF.

Figure 6A:
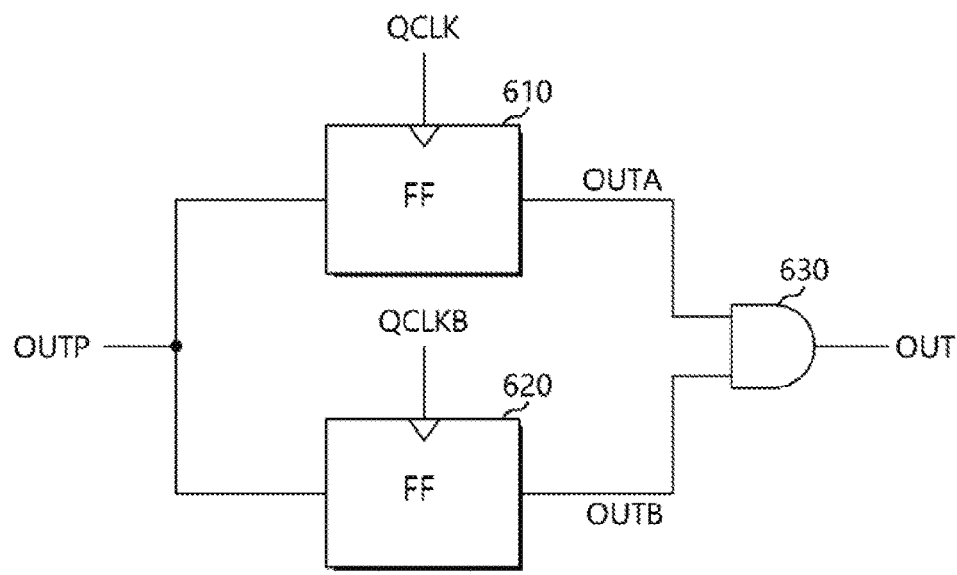
FIGS. 6A and 6B are diagrams illustrating a configuration and operation of a retiming circuit according to various embodiments.
Figure 6B:
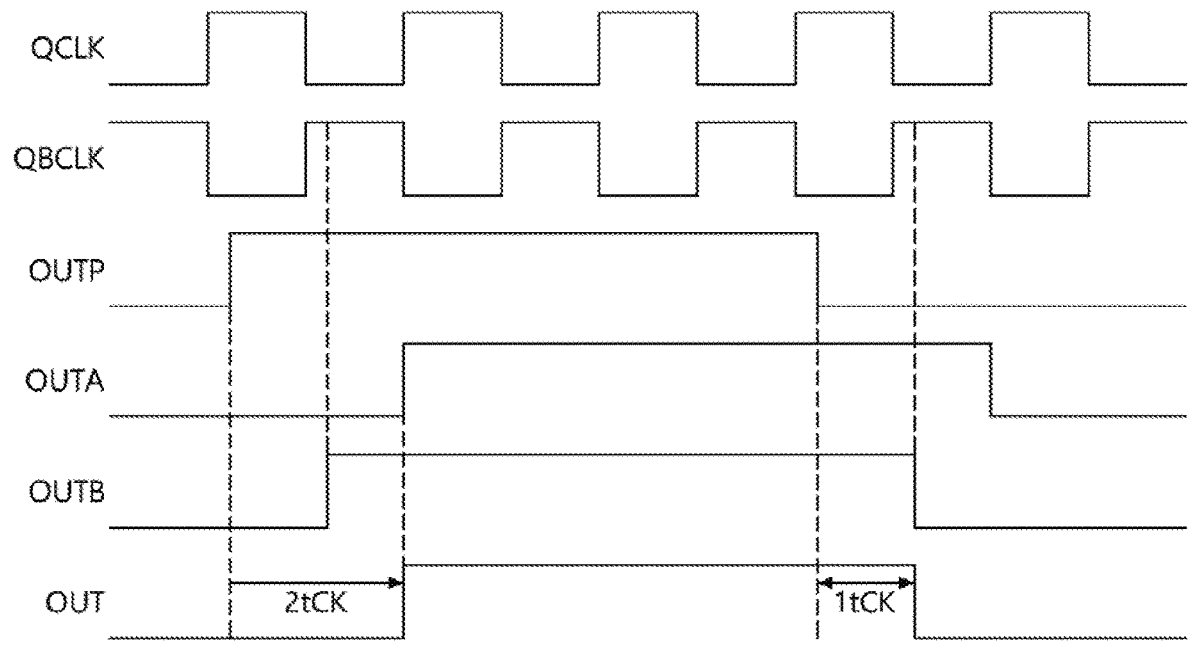

FIG. 6A is a diagram illustrating a configuration of a retiming circuit 600 according to various embodiments. FIG. 6B is a timing diagram illustrating an operation of the retiming circuit 600 illustrated in FIG. 6A. The retiming circuit 600 may be applied as the retiming circuit 130 illustrated in FIG. 1. In FIG. 6A, the retiming circuit 600 may include a first FF 610, a second FF 620, and a logic gate 630. The first FF 610 may receive the preliminary output signal OUTP and the first division clock signal QCLK. The first FF 610 may output an output signal OUTA by synchronizing the preliminary output signal OUTP with the first division clock signal QCLK. The second FF 620 may receive the preliminary output signal OUTP and the second division clock signal QBCLK. The second FF 620 may output an output signal OUTB by synchronizing the preliminary output signal OUTP with the second division clock signal QBCLK. The logic gate 630 may generate the output signal OUT by gating the output signal OUTA of the first FF 610 and the output signal OUTB of the second FF 620. The logic gate 630 may include an AND gate. The logic gate 630 may generate the output signal OUT by performing an AND operation on the output signal OUTA of the first FF 610 and the output signal OUTB of the second FF 620. The retiming circuit 600 may be a retimer of an AND type.

As illustrated in FIG. 6B, when the preliminary output signal OUTP is enabled after a first rising edge of the first division clock signal QCLK occurs and is disabled after a fourth rising edge of the first division clock signal QCLK occurs, the output signal OUTA of the first FF 610 may be enabled in synchronization with a second rising edge of the first division clock signal QCLK and may be disabled in synchronization with a fifth rising edge of the first division clock signal QCLK. Furthermore, the output signal OUTB of the second FF 620 may be enabled in synchronization with a first rising edge of the second division clock signal QBCLK and may be disabled in synchronization with a fourth rising edge of the second division clock signal QBCLK. The logic gate 630 may generate the output signal OUT by AND-gating the output signals OUTA and OUTB of the first and second FFs 610 and 620. Accordingly, the output signal OUT may be delayed and enabled by about one cycle of the first division clock signal QCLK compared to the preliminary output signal OUTP, and may be delayed and enabled by about ½ cycle of the first division clock signal QCLK compared to the preliminary output signal OUTP. That is, the output signal OUT may be delayed and enabled by two cycles of the clock signal CLK (shown in FIG. 6B as 2tCK) compared to the preliminary output signal OUTP, and may be delayed and disabled by one cycle of the clock signal CLK (shown in FIG. 6B as 1tCK) compared to the preliminary output signal OUTP. Accordingly, the on-offset signal OSE during the retiming latency of the retiming circuit 600 may correspond to 2. The off-offset signal OSD during the retiming latency of the retiming circuit 600 may correspond to 1. That is, in the retiming circuit 600, as the preliminary output signal OUTP is retimed based on the first and second division clock signals QCLK and QBCLK, enabling timing of the output signal OUT may be delayed by two cycles of the clock signal CLK compared to enabling timing of the preliminary output signal OUTP, and disabling timing of the output signal OUT may be delayed by one cycle of the clock signal CLK compared to disabling timing of the preliminary output signal OUTP. Accordingly, the pulse width control circuit 150 may previously compensate for a delay quantity occurring in the retiming circuit 600 by adjusting the on-control signal ON and the off-control signal OFF based on the on-offset signal OSE and off-offset signal OSD corresponding to the retiming latency of the retiming circuit 600. If the signal generation circuit 100 illustrated in FIG. 1 adopts the retiming circuit 600 illustrated in FIG. 6A, the on-control signal ON may correspond to a value obtained by subtracting 2 from the operation latency LAT, and the off-control signal OFF may correspond to a value obtained by subtracting 1 from the operation section information BL.

Figure 7A:
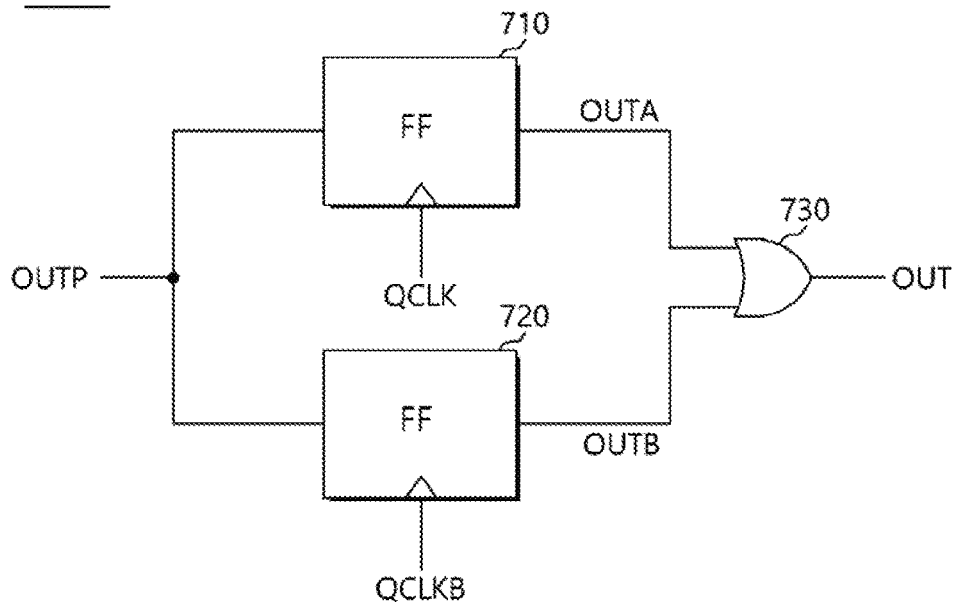
FIGS. 7A and 7B are diagrams illustrating a configuration and operation of a retiming circuit according to various embodiments.
Figure 7B:
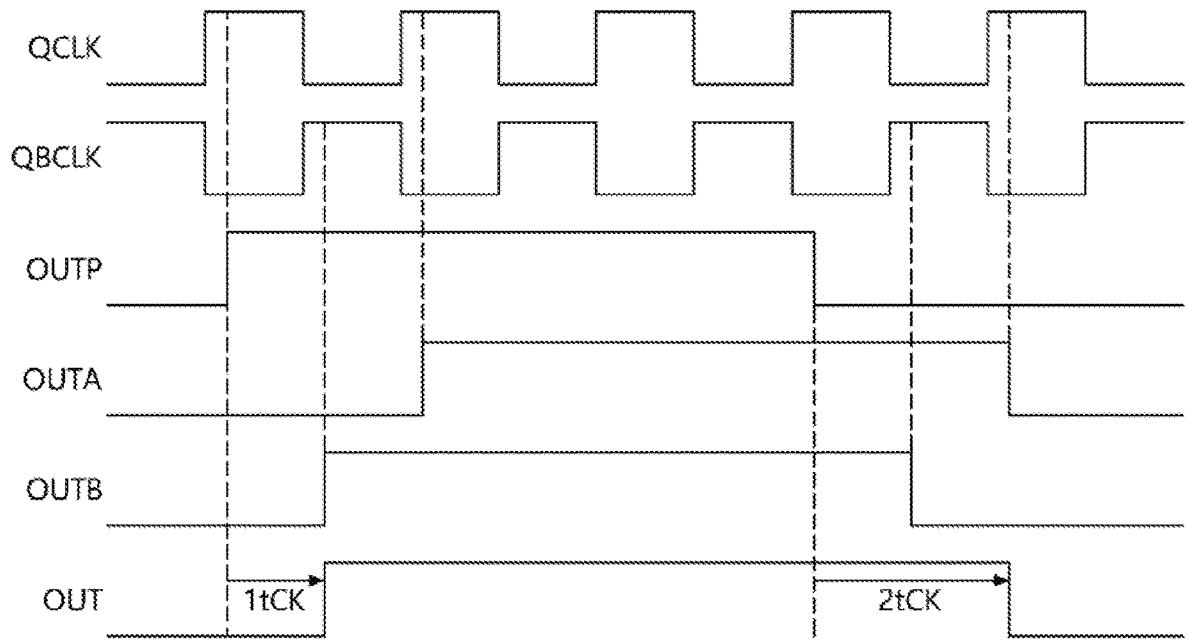

FIG. 7A is a diagram illustrating a configuration of a retiming circuit 700 according to various embodiments. FIG. 7B is a timing diagram illustrating an operation of the retiming circuit 700 illustrated in FIG. 7A. The retiming circuit 700 may be applied as the retiming circuit 130 illustrated in FIG. 1. In FIG. 7A, the retiming circuit 700 may include a first FF 710, a second FF 720, and a logic gate 730. The first FF 710 may receive the preliminary output signal OUTP and the first division clock signal QCLK. The first FF 710 may output the output signal OUTA by synchronizing the preliminary output signal OUTP with the first division clock signal QCLK. The second FF 720 may receive the preliminary output signal OUTP and the second division clock signal QBCLK. The second FF 720 may output the output signal OUTB by synchronizing the preliminary output signal OUTP with the second division clock signal QBCLK. The logic gate 730 may generate the output signal OUT by gating the output signal OUTA of the first FF 710 and the output signal OUTB of the second FF 720. The logic gate 730 may include an OR gate. The logic gate 730 may generate the output signal OUT by performing an OR operation on the output signal OUTA of the first FF 710 and the output signal OUTB of the second FF 720. The retiming circuit 700 may be a retimer of an OR type.

As illustrated in FIG. 7B, when the preliminary output signal OUTP is enabled after a first rising edge of the first division clock signal QCLK occurs and is disabled after a fourth rising edge of the first division clock signal QCLK occurs, the output signal OUTA of the first FF 710 may be enabled in synchronization with a second rising edge of the first division clock signal QCLK, and may be disabled in synchronization with a fifth rising edge of the first division clock signal QCLK. Furthermore, the output signal OUTB of the second FF 720 may be enabled in synchronization with a first rising edge of the second division clock signal QBCLK, and may be disabled in synchronization with a fourth rising edge of the second division clock signal QBCLK. The logic gate 730 may generate the output signal OUT by OR-gating the output signals OUTA and OUTB of the first and second FFs 710 and 720. Accordingly, the output signal OUT may be delayed and enabled by about one cycle of the clock signal CLK (shown in FIG. 7B as 1tCK) compared to the preliminary output signal OUTP, and may be delayed and disabled by about two cycles of the clock signal CLK (shown in FIG. 7B as 2tCK) compared to the preliminary output signal OUTP. Accordingly, the on-offset signal OSE during the retiming latency of the retiming circuit 700 may correspond to 1. The off-offset signal OSD during the retiming latency of the retiming circuit 700 may correspond to 2. That is, in the retiming circuit 700, as the preliminary output signal OUTP is retimed based on the first and second division clock signals QCLK and QBCLK, enabling timing of the output signal OUT may be delayed by two cycles of the clock signal CLK compared to enabling timing of the preliminary output signal OUTP, and disabling timing of the output signal OUT may be delayed by one cycle of the clock signal CLK compared to disabling timing of the preliminary output signal OUTP. Accordingly, the pulse width control circuit 150 may previously compensate for a delay quantity occurring in the retiming circuit 700 by adjusting the on-control signal ON and the off-control signal OFF based on the on-offset signal OSE and off-offset signal OSD corresponding to the retiming latency of the retiming circuit 700. If the signal generation circuit 100 illustrated in FIG. 1 adopts the retiming circuit 700 illustrated in FIG. 7A, the on-control signal ON may correspond to a value obtained by subtracting 1 from the operation latency LAT, and the off-control signal OFF may correspond to a value obtained by subtracting 2 from the operation section information BL.

Figure 8:
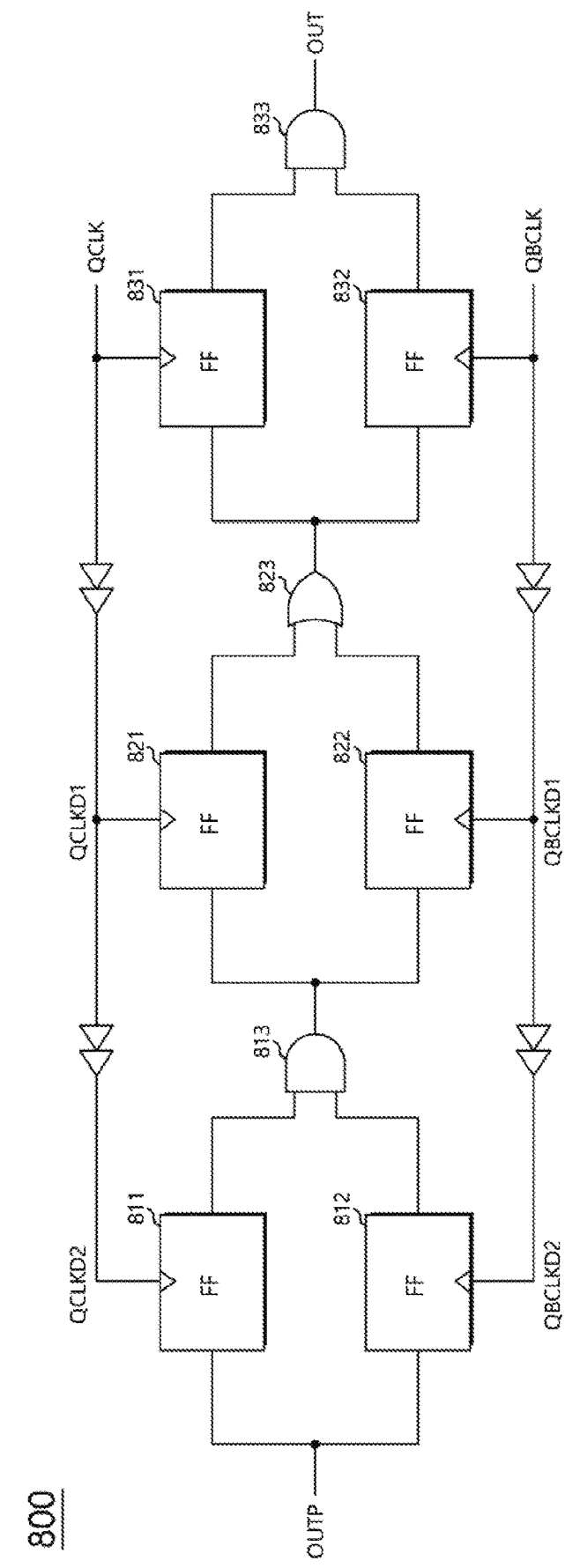
FIG. 8 is a diagram illustrating a configuration of a retiming circuit according to various embodiments.

FIG. 8 is a diagram illustrating a configuration of a retiming circuit 800 according to various embodiments. The retiming circuit 800 may be applied as the retiming circuit 130 illustrated in FIG. 1. In FIG. 8, the retiming circuit 800 may have a form in which at least one of the retimer of an AND type illustrated in FIG. 6A and the retimer of an OR type illustrated in FIG. 7A has been combined. In FIG. 8, the retiming circuit 800 may have a form in which two retimers of an AND type and one retimer of an OR type are combined. The retiming circuit 800 may include a first FF 811, a second FF 812, a first logic gate 813, a third FF 821, a fourth FF 822, a second logic gate 823, a fifth FF 831, a sixth FF 832, and a third logic gate 833. The fifth FF 831 may receive the first division clock signal QCLK. The third FF 821 may receive a first delay clock signal QCLKD1 delayed by a first time from the first division clock signal QCLK. The first FF 811 may receive a second delay clock signal QCLKD2 delayed by a second time from the first delay clock signal QCLKD1. The sixth FF 832 may receive the second division clock signal QBCLK. The fourth FF 822 may receive a third delay clock signal QBCLKD1 delayed by one time from the second division clock signal QBCLK. The second FF 812 may receive a fourth delay clock signal QBCLKD2 delayed by two times from the third delay clock signal QBCLKD1. When the retiming circuit 800 includes a plurality of FFs that are electrically coupled in series, an FF close to the output terminal of the retiming circuit 800 among the plurality of FFs may be configured to receive a clock signal having an early phase, and an FF close to the input terminal of the retiming circuit 800 among the plurality of FFs may be configured to receive a clock signal having a late phase. The first logic gate 813 may be an AND gate. The second logic gate 823 may be an OR gate. The third logic gate 833 may be an AND gate.

The first FF 811 may output a signal by synchronizing the preliminary output signal OUTP with the second delay clock signal QCLKD2. The second FF 812 may output a signal by synchronizing the preliminary output signal OUTP with the fourth delay clock signal QBCLKD2. The first logic gate 813 may output an output by AND-gating the signals output by the first and second FFs 811 and 812. The third FF 821 may output a signal by synchronizing the output of the first logic gate 813 with the first delay clock signal QCLKD1. The fourth FF 822 may output a signal by synchronizing the output of the first logic gate 813 with the third delay clock signal QBCLKD1. The second logic gate 823 may output an output by OR-gating the signals output by the third and fourth FFs 821 and 822. The fifth FF 831 may output a signal by synchronizing the output of the second logic gate 823 with the first division clock signal QCLK. The sixth FF 832 may output a signal by synchronizing the output of the second logic gate 823 with the second division clock signal QBCLK. The third logic gate 833 may output the output signal OUT by AND-gating the signals output by the fifth and sixth FFs 831 and 832.

The retiming circuit 800 may have a structure in which a retimer of an AND type, a retimer of an OR type, and a retimer of an AND type have been sequentially and electrically coupled. Accordingly, the output signal OUT output by the retiming circuit 800 may be delayed and enabled by five cycles of the clock signal CLK compared to the preliminary output signal OUTP, and may be delayed and disabled by four cycles of the clock signal CLK. An on-offset signal OSE related to the retiming circuit 800 may have a value corresponding to 5. An off-offset signal OSD related to the retiming circuit 800 may have a value corresponding to 4. When the signal generation circuit 100 adopts the retiming circuit 800, the pulse width control circuit 150 may generate an on-control signal ON corresponding to a value obtained by subtracting 5 from the operation latency LAT, and may generate an off-control signal OFF corresponding to a value obtained by subtracting 4 from the operation section information BL.

Figure 9:
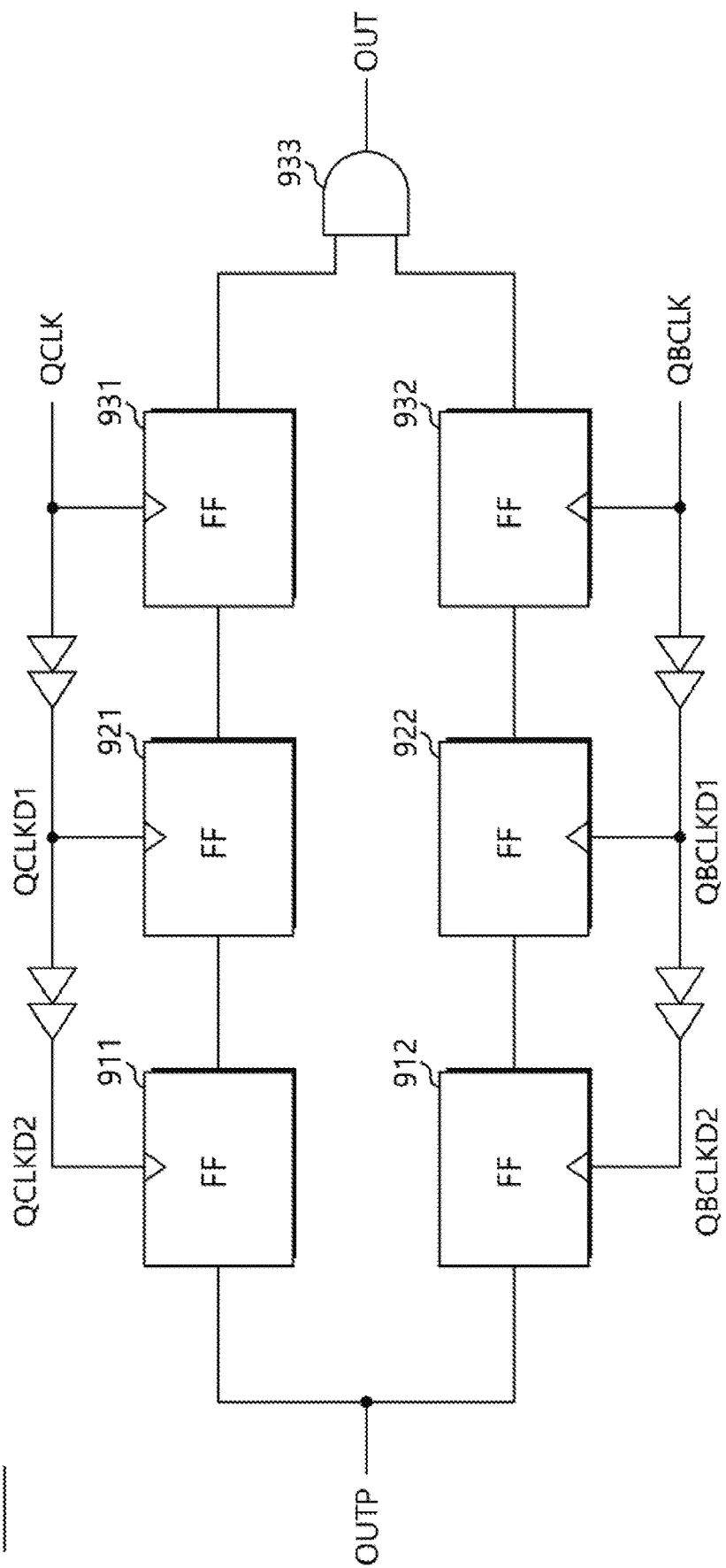
FIG. 9 is a diagram illustrating a configuration of a retiming circuit according to various embodiments.

FIG. 9 is a diagram illustrating a configuration of a retiming circuit 900 according to various embodiments. The retiming circuit 900 may be applied as the retiming circuit 130 illustrated in FIG. 1. In FIG. 9, the retiming circuit 900 may include a first FF 911, a second FF 912, a third FF 921, a fourth FF 922, a fifth FF 931, a sixth FF 932, and a logic gate 933. Unlike in FIG. 8, in the retiming circuit 900, signals output by the first and second FFs 911 and 912 might not be gated by a logic gate, and may be input to the third and fourth FFs 921 and 922, respectively. Signals output by the third and fourth FFs 921 and 922 might not be gated by a logic gate, and may be input to the fifth and sixth FFs 931 and 932, respectively. A portion configured with only two FFs without a logic gate may be a retimer of an FF type. The output signal of the retimer of an FF type may be delayed and enabled by one cycle of the first or second division clock signal QCLK or QBCLK or two cycles of the clock signal CLK compared to an input signal, and may be delayed and disabled by one cycle of the first or second division clock signal QCLK or QBCLK or two cycles of the clock signal CLK.

The first FF 911 may output a signal by synchronizing the preliminary output signal OUTP with the second delay clock signal QCLKD2. The second FF 912 may output a signal by synchronizing the preliminary output signal OUTP with the fourth delay clock signal QBCLKD2. The third FF 921 may output a signal by synchronizing the signal, output by the first FF 911, with the first delay clock signal QCLKD1. The fourth FF 922 may output a signal by synchronizing the signal, output by the second FF 912, with the third delay clock signal QBCLKD1. The fifth FF 931 may output a signal by synchronizing the signal, output by the third FF 921, with the first division clock signal QCLK. The sixth FF 932 may output a signal by synchronizing the signal, output by the fourth FF 922, with the second division clock signal QBCLK. The logic gate 933 may be an AND gate. The logic gate 933 may generate the output signal OUT by AND-gating the signals output by the fifth and sixth FFs 931 and 932.

In FIG. 9, the retiming circuit 900 may have a form in which two retimers of an FF type and one retimer of an AND type have been combined. Accordingly, the output signal OUT output by the retiming circuit 900 may be delayed and enabled by six cycles of the clock signal CLK compared to the preliminary output signal OUTP, and may be delayed and disabled by five cycles of the clock signal CLK compared to the preliminary output signal OUTP. An on-offset signal OSE related to the retiming circuit 900 may have a value corresponding to 6. An off-offset signal OSD related to the retiming circuit 900 may have a value corresponding to 5. When the signal generation circuit 100 adopts the retiming circuit 900, the pulse width control circuit 150 may generate an on-control signal ON corresponding to a value obtained by subtracting 6 from the operation latency LAT, and may generate an off-control signal OFF corresponding to a value obtained by subtracting 5 from the operation section information BL.

In an embodiment, the logic gate 933 may be substituted with an OR gate. In this case, an on-offset signal OSE related to the retiming circuit 900 may have a value corresponding to 5, and an off-offset signal OSD related to the retiming circuit 900 may have a value corresponding to 6. The pulse width control circuit 150 may generate an on-control signal ON corresponding to a value obtained by subtracting 5 from the operation latency LAT, and may generate an off-control signal OFF corresponding to a value obtained by subtracting 6 from the operation section information BL.

Figure 10:
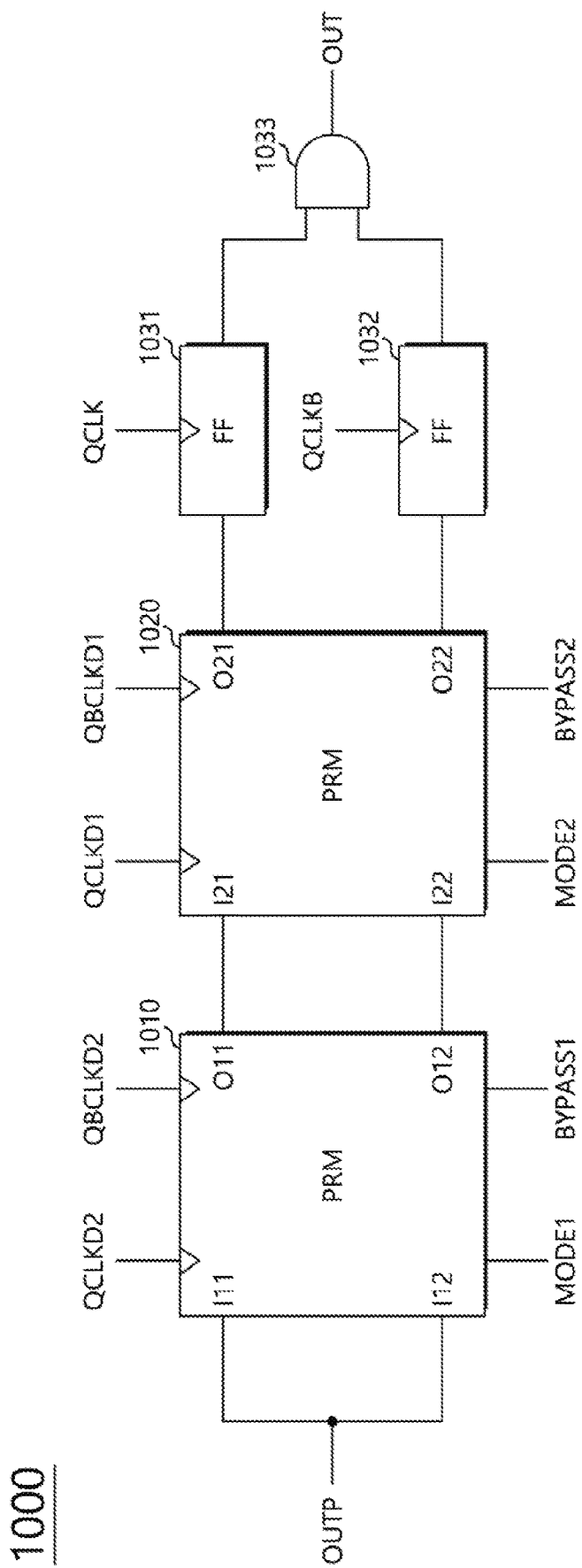
FIG. 10 is a diagram illustrating a configuration of a retiming circuit according to various embodiments.

FIG. 10 is a diagram illustrating a configuration of a retiming circuit 1000 according to various embodiments. The retiming circuit 1000 may be applied as the retiming circuit 130 illustrated in FIG. 1. The retiming circuit 1000 may include at least one programmable retiming module (PRM). The programmable retiming module may receive a mode signal and a bypass signal. The latency of the programmable retiming module may be determined based on the mode signal and the bypass signal. The programmable retiming module may operate as one of the retiming circuit of an AND type, the retiming circuit of an OR type, and the retiming circuit of an FF type based on the mode signal and the bypass signal.

In FIG. 10, the retiming circuit 1000 may include a first PRM 1010, a second PRM 1020, and a retimer of an AND type. Each of the first and second PRMs 1010 and 1020 may include two input terminals and two output terminals. The first PRM 1010 may receive a first mode signal MODE1 and a first bypass signal BYPASS1. The second PRM 1020 may receive a second mode signal MODE2 and a second bypass signal BYPASS2. The first PRM 1010 may operate as one of a retimer of an AND type, a retimer of an OR type, and a retimer of an FF type based on the first mode signal MODE1 and the first bypass signal BYPASS1. The second PRM 1020 may operate as one of a retimer of an AND type, a retimer of an OR type, and a retimer of an FF type based on the second mode signal MODE2 and the second bypass signal BYPASS2.

The first PRM 1010 may receive the preliminary output signal OUTP through each of first and second input terminals I11 and I12, and may output signals by synchronizing the preliminary output signal OUTP with the second delay clock signal QCLKD2 and the fourth delay clock signal QBCLKD2. The first PRM 1010 may AND-gate or OR-gate the signals, output in synchronization with the second and fourth delay clock signals QCLKD2 and QBCLKD2, based on the first mode signal MODE1. The first PRM 1010 may output the signals, output in synchronization with the second and fourth clock signals QCLKD2 and QBCLKD2, to first and second output terminals O11 and O12, respectively, based on the bypass signal BYPASS1, or may output the AND-gated or OR-gated signals to the first and second output terminals O11 and O12.

First and second input terminals I21 and I22 of the second PRM 1020 may be electrically coupled to the first and second output terminals O11 and O12 of the first PRM 1010, respectively. The second PRM 1020 may output a signal by synchronizing the signal, output by the first output terminal O11 of the first PRM 1010, with the first delay clock signal QCLKD1, and may output a signal by synchronizing the signal, output by the second output terminal O12 of the first PRM 1010, with the third delay clock signal QBCLKD1. The second PRM 1020 may AND-gate or OR-gate the signals, output in synchronization with the first and third delay clock signals QCLKD1 and QBCLKD1, based on the second mode signal MODE2. The second PRM 1020 may output the signals, output in synchronization with the first and third delay clock signals QCLKD1 and QBCLKD2, to first and second output terminals O21 and O22, respectively, based on the second bypass signal BYPASS2, or may output the AND-gated or OR-gated signals to the first and second output terminals O21 and O22.

A first FF 1031 may output a signal by synchronizing the signal, output by the first output terminal O21 of the second PRM 1020, with the first division clock signal QCLK. The second FF 1032 may output a signal by synchronizing the signal, output by the second output terminal O22 of the second PRM 1020, with the second division clock signal QBCLK. A logic gate 1033 may generate the output signal OUT by AND-gating the signals output by the first and second FFs 1031 and 1032. An on-offset signal OSE and off-offset signal OSD of the retiming circuit 1000 may be determined by the first and second mode signals MODE1 and MODE2 and the first and second bypass signals BYPASS1 and BYPASS2.

Figure 11:
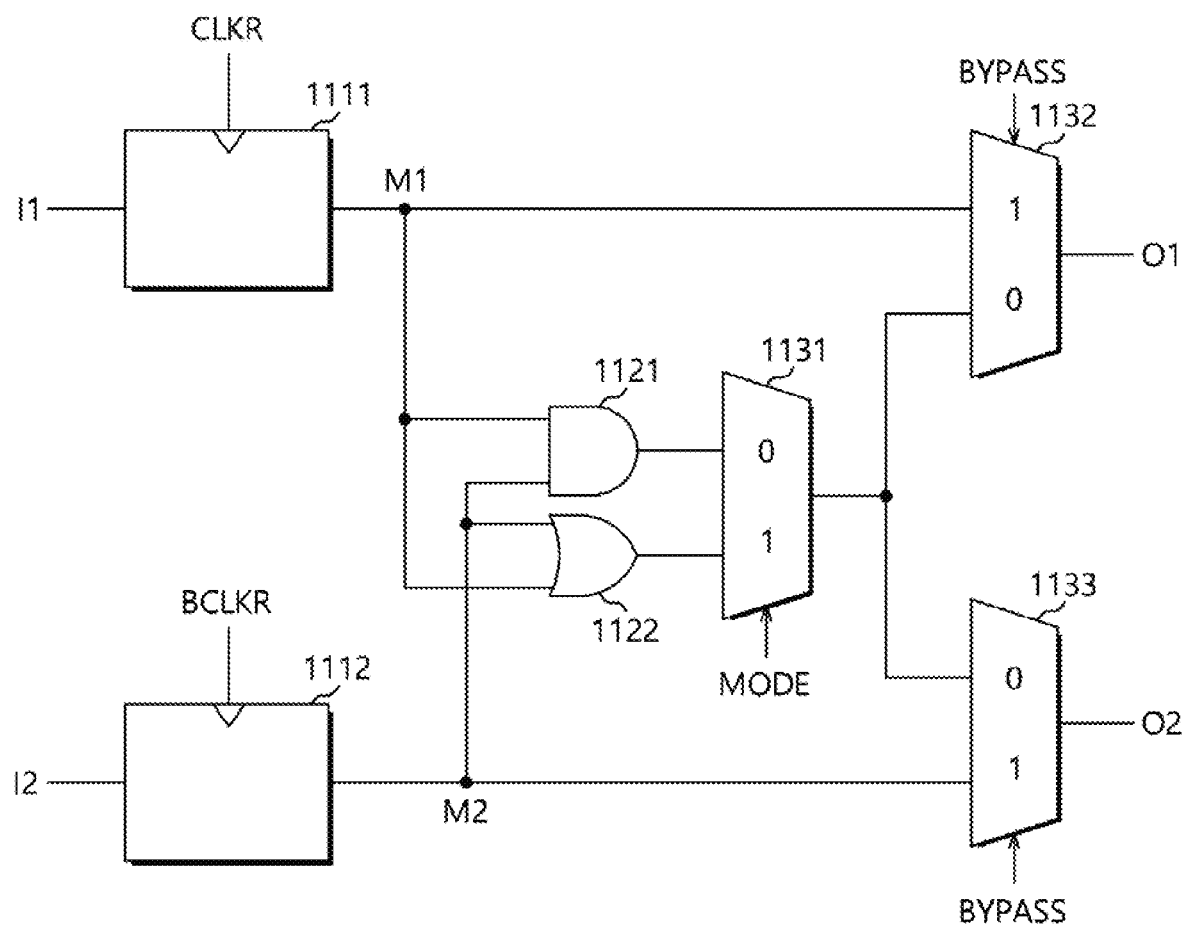
FIG. 11 is a diagram illustrating a configuration of a programmable retiming module illustrated in FIG. 10.

FIG. 11 is a diagram illustrating a configuration of a programmable retiming module (PRM) 1100 according to various embodiments. The PRM 1100 may be applied as each of the first and second PRMs 1010 and 1020 illustrated in FIG. 10. In FIG. 11, the PRM 1100 may include a first FF 1111, a second FF 1112, an AND gate 1121, an OR gate 1122, a first multiplexer 1131, a second multiplexer 1132, and a third multiplexer 1133. The first FF 1111 may receive a signal through a first input terminal I1, and may output an output signal M1 by synchronizing the received signal with a received clock signal CLKR. The second FF 1112 may receive a signal through a second input terminal I2, and may output an output signal M2 by synchronizing the received signal with a received clock signal BCLKR. For example, the clock signal CLKR received by the first FF 1111 may be the first division clock signal QCLK, the first delay clock signal QCLKD1, or the second delay clock signal QCLKD2. The clock signal BCLKR received by the second FF 1112 may be the second division clock signal QBCLK, the third delay clock signal QBCLKD1, or the fourth delay clock signal QBCLKD2.

The AND gate 1121 may output a signal by AND-gating the output signals M1 and M2 of the first and second FFs 1111 and 1112. The OR gate 1122 may output a signal by OR-gating the output signals M1 and M2 of the first and second FFs 1111 and 1112. The first multiplexer 1131 may receive the signals output by the AND gate 1121 and the OR gate 1122, and may output one of the signals based on a mode signal MODE. For example, when a level of the mode signal MODE is a logic low level, the first multiplexer 1131 may output the signal output by the AND gate 1121. When a level of the mode signal MODE is a logic high level, the first multiplexer 1131 may output the signal output by the OR gate 1122.

The second multiplexer 1132 may receive the output signal M1 of the first FF 1111 and the signal output by the first multiplexer 1131. The second multiplexer 1132 may output one of the signals to a first output terminal O1 based on the bypass signal BYPASS. For example, when a level of the bypass signal BYPASS is a logic high level, the second multiplexer 1132 may output the output signal M1 of the first FF 1111 to the first output terminal I1. When a level of the bypass signal BYPASS is a logic low level, the second multiplexer 1132 may output, to the first output terminal I1, the signal output by the first multiplexer 1131.

The third multiplexer 1133 may receive the output signal M2 of the second FF 1112 and the signal output by the first multiplexer 1131. The third multiplexer 1133 may output one of the signals to a second output terminal I2 based on the bypass signal BYPASS. For example, when a level of the bypass signal BYPASS is a logic high level, the third multiplexer 1133 may output the output signal M2 of the second FF 1112 to the second output terminal I2. When a level of the bypass signal BYPASS is a logic low level, the third multiplexer 1133 may output, to the second output terminal I2, the signal output by the first multiplexer 1131.

FIG. 12 is a table illustrating retiming latency of the PRM set in response to a mode signal MODE and a bypass signal BYPASS. Referring to FIG. 12, when both levels of the bypass signal BYPASS and the mode signal MODE are logic low levels, the PRM 1100 may operate as a retimer of an AND type. Accordingly, the on-offset signal OSE of the PRM 1100 may have a value corresponding to 2, and the off-offset signal OSD of the PRM 1100 may have a value corresponding to 1. When a level of the bypass signal BYPASS is a logic low level and a level of the mode signal MODE is a logic high level, the PRM 1100 may operate as a retimer of an OR type. Accordingly, the on-offset signal OSE of the PRM 1100 may have a value corresponding to 1, and the off-offset signal OSD of the PRM 1100 may have a value corresponding to 2. When a level of the bypass signal BYPASS is a logic high level, the PRM 1100 may operate as a retimer of an FF type regardless of a logic level of the mode signal MODE. Accordingly, the on-offset signal OSE of the PRM 1100 may have a value corresponding to 2, and the off-offset signal OSD of the PRM 1100 may have a value corresponding to 2.

Figure 13:
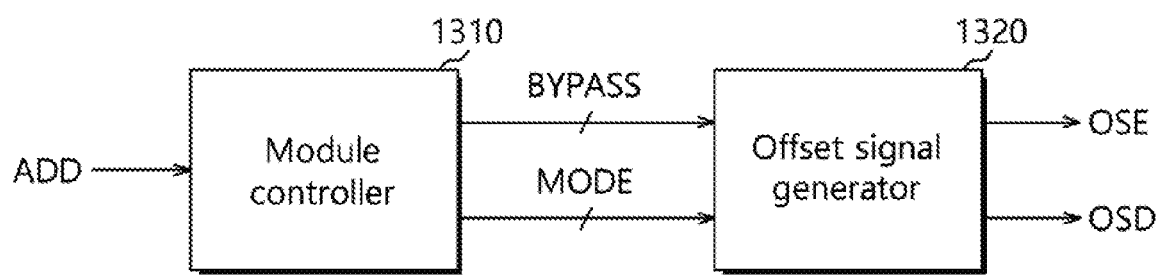
FIG. 13 is a diagram illustrating a configuration of at least some of a pulse width control circuit according to various embodiments.

FIG. 13 is a diagram illustrating a configuration of at least some of a pulse width control circuit 1300 according to various embodiments. In FIG. 13, the pulse width control circuit 1300 may include a module controller 1310 and an offset signal generator 1320. The module controller 1310 may generate a plurality of mode signals MODE and a plurality of bypass signals BYPASS for controlling a plurality of PRMs. The module controller 1310 may receive an address signal ADD and generate the plurality of mode signals MODE and the plurality of bypass signals BYPASS. The module controller 1310 may generate the plurality of mode signals MODE and the plurality of bypass signals BYPASS having various combinations of logic levels based on the address signal ADD. The offset signal generator 1320 may receive the plurality of mode signals MODE and the plurality of bypass signals BYPASS, and may generate an on-offset signal OSE and an off-offset signal OSD based on a combination of logic levels of the plurality of mode signals MODE and a combination of logic levels of the plurality of bypass signals BYPASS. The on-offset signal OSE and the off-offset signal OSD may be input to the on-control signal generator 520 and off-control signal generator 530 illustrated in FIG. 5.

Figure 14:
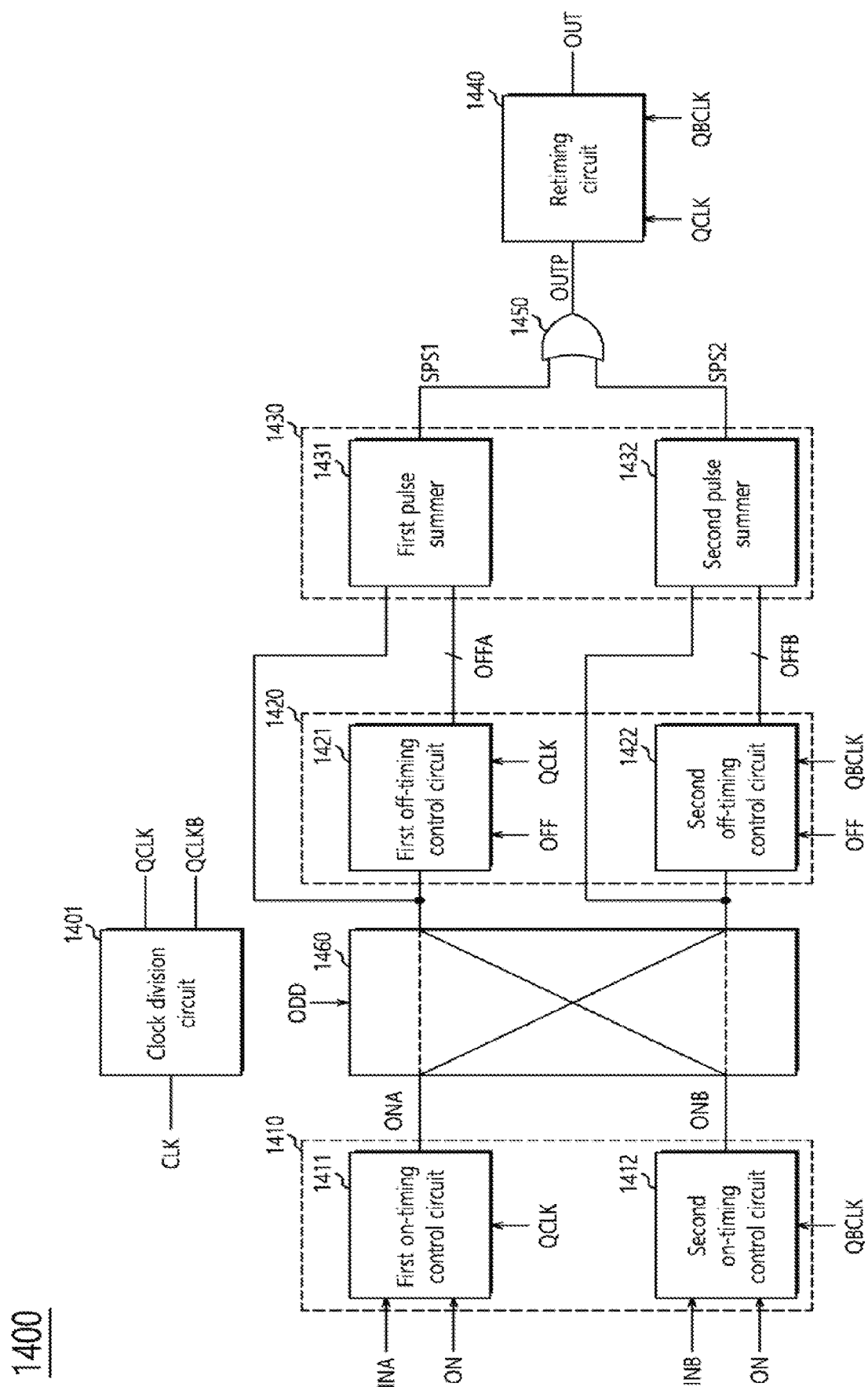
FIG. 14 is a diagram illustrating a configuration of a signal generation circuit according to various embodiments.

FIG. 14 is a diagram illustrating a configuration of a signal generation circuit 1400 according to various embodiments. In FIG. 14, the signal generation circuit 1400 may have a configuration similar to that of the signal generation circuit 100, the first synchronization signal generation circuit 110 and the second synchronization signal generation circuit 120, which are illustrated in FIGS. 1 and 2. A redundant description of the same element is omitted. In FIG. 14, the signal generation circuit 1400 may include a clock division circuit 1401, an on-pulse generation circuit 1410, an off-pulse generation circuit 1420, a pulse sum circuit 1430 and a retiming circuit 1440. The on-pulse generation circuit 1410 may generate an even on-pulse signal ONA by delaying a first input signal INA based on a first division clock signal QCLK and an on-control signal ON, and may generate an odd on-pulse signal ONB by delaying a second input signal INB based on a second division clock signal QBCLK and the on-control signal ON. The off-pulse generation circuit 1420 may generate a plurality of even off-pulse signals OFFA by delaying one of the even on-pulse signal ONA and the odd on-pulse signal ONB based on the first division clock signal QCLK and an off-control signal OFF, and may generate a plurality of odd off-pulse signals OFFB by delaying one of the even on-pulse signal ONA and the odd on-pulse signal ONB based on the second division clock signal QBCLK and the off-control signal OFF.

The pulse sum circuit 1430 may generate a first synchronization signal SPS1 by combining one of the even on-pulse signal ONA and the odd on-pulse signal ONB and the plurality of even off-pulse signals OFFA, and may generate a second synchronization signal SPS2 by combining one of the even on-pulse signal ONA and the odd on-pulse signal ONB and the plurality of odd off-pulse signals OFFB. The retiming circuit 1440 may generate an output signal OUT by retiming a preliminary output signal OUTP, generated from one of the first and second synchronization signals SPS1 and SPS2, based on the first and second division clock signals QCLK and QBCLK.

The on-pulse generation circuit 1410 may include a first on-timing control circuit 1411 and a second on-timing control circuit 1412. The first on-timing control circuit 1411 may generate the even on-pulse signal ONA by delaying the first input signal INA based on the on-control signal ON and the first division clock signal QCLK. The second on-timing control circuit 1412 may generate the odd on-pulse signal ONB by delaying the second input signal INB based on the on-control signal ON and the second division clock signal QBCLK.

The off-pulse generation circuit 1420 may include a first off-timing control circuit 1421 and a second off-timing control circuit 1422. The first off-timing control circuit 1421 may generate the plurality of even off-pulse signals OFFA by delaying one of the even on-pulse signal ONA and the odd on-pulse signal ONB based on the off-control signal OFF and the first division clock signal QCLK. The second off-timing control circuit 1422 may generate the plurality of odd off-pulse signals OFFB by delaying one of the even on-pulse signal ONA and the odd on-pulse signal ONB based on the off-control signal OFF and the second division clock signal QBCLK.

The pulse sum circuit 1430 may include a first pulse summer 1431 and a second pulse summer 1432. The first pulse summer 1431 may generate the first synchronization signal SPS1 by adding one of the even on-pulse signal ONA and the odd on-pulse signal ONB and the plurality of even off-pulse signals OFFA. The second pulse summer 1432 may generate the second synchronization signal SPS2 by adding one of the even on-pulse signal ONA and the odd on-pulse signal ONB and the plurality of odd off-pulse signals OFFB. The signal generation circuit 1400 may further include a gating circuit 1450. The gating circuit 1450 may generate the preliminary output signal OUTP by OR-gating the first and second synchronization signals SPS1 and SPS2.

The signal generation circuit 1400 may further include a switching circuit 1460. The switching circuit 1460 may receive an odd flag ODD. The switching circuit 1460 may output the even on-pulse signal ONA to one of the first and second off-timing control circuits 1421 and 1422 based on the odd flag signal ODD, and may output the odd on-pulse signal ONB to one of the first and second off-timing control circuits 1421 and 1422 based on the odd flag signal ODD. When the first or second on-timing control circuit 1411 or 1412 is implemented as the first on-timing control circuit 300 illustrated in FIG. 3, a unit delay quantity of the first or second on-timing control circuit 1411 or 1412 may correspond to one cycle of the first division clock signal QCLK or two cycles of the clock signal CLK. That is, the unit delay quantity of the first or second on-timing control circuit 1411 or 1412 may be twice a unit time. In contrast, a unit delay quantity of the first or second off-timing control circuit 1421 or 1422 may correspond to ½ cycle of the first division clock signal QCLK or one cycle of the clock signal CLK. Accordingly, when the on-control signal ON corresponds to an odd number, the first or second on-timing control circuit 1411 or 1412 cannot generate an on pulse signal ONA delayed by a time corresponding to an odd on-control signal ON.

The odd flag ODD may have a logic high level when the on-control signal ON corresponds to an odd number, and may have a logic low level when the on-control signal ON corresponds to an even number. The switching circuit 1460 may output the even on-pulse signal ONA to the second off-timing control circuit 1422 and output the odd on-pulse signal ONB to the first off-timing control circuit 1421, when the odd flag ODD has a logic high level. The switching circuit 1460 may output the even on-pulse signal ONA to the first off-timing control circuit 1421 and output the odd on-pulse signal ONB to the second off-timing control circuit 1422, when the odd flag ODD has a logic low level. For example, the signal generation circuit 1400 may operate as follows. When the on-control signal ON is 5, the on-control signal ON is an odd number. Accordingly, the first on-timing control circuit 1411 may generate the even on-pulse signal ONA by delaying the first input signal INA by six cycles of the clock signal CLK. The switching circuit 1460 may output the even on-pulse signal ONA to the second off-timing control circuit 1422 based on the odd flag ODD. The second off-timing control circuit 1422 may operate in synchronization with the second division clock signal QBCLK, and thus may delay the even on-pulse signal ONA at timing prior to a phase of 180 degrees compared to a case where the even on-pulse signal ONA is delayed in synchronization with the first division clock signal QCLK. Accordingly, when the on-control signal ON corresponds to an odd number, a time additionally delayed in the first or second on-timing control circuit 1411 or 1412 may be compensated for by the first or second off-timing control circuit 1421 or 1422.

Figure 15:
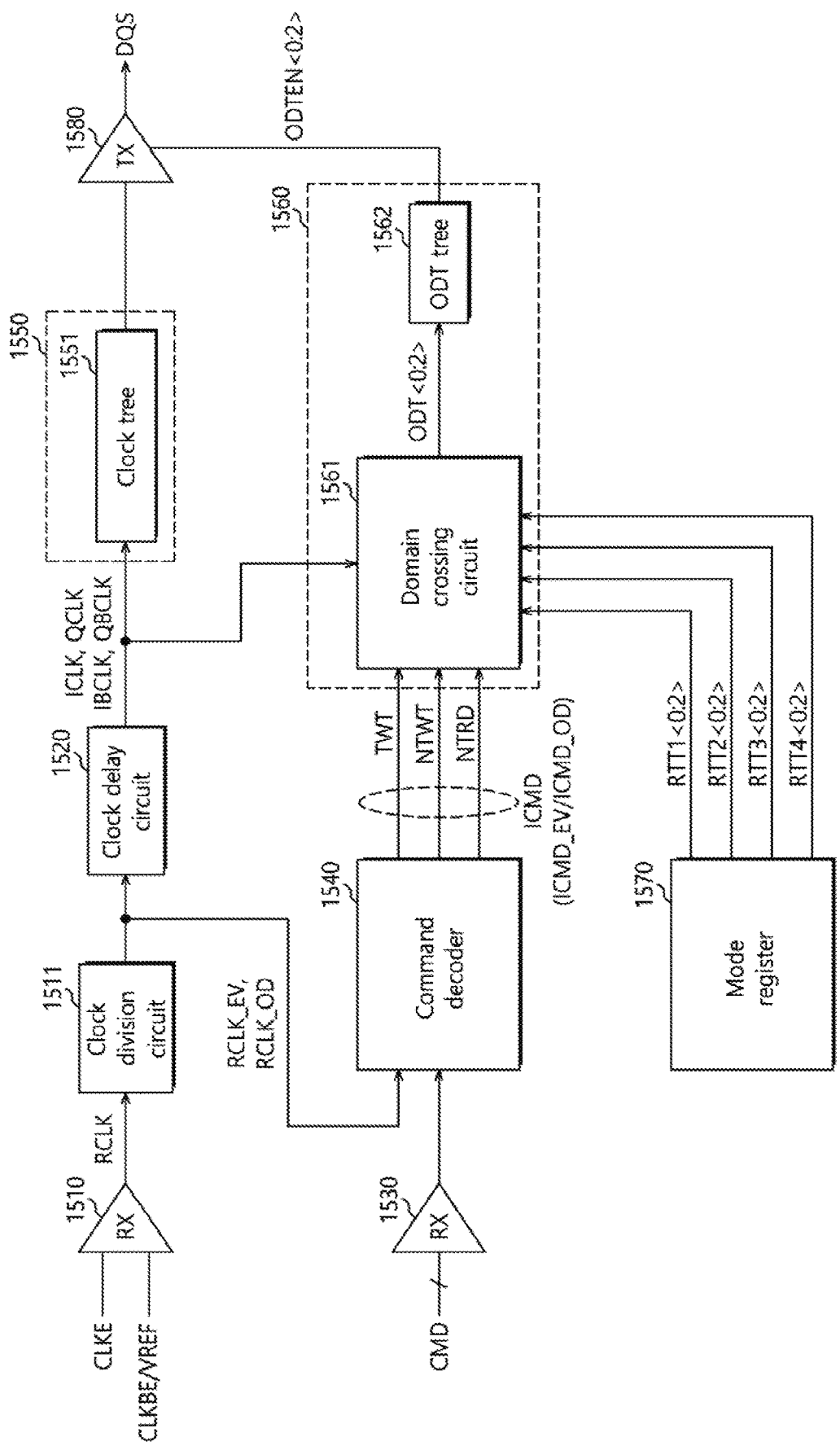
FIG. 15 is a diagram illustrating a configuration of a semiconductor apparatus according to various embodiments.

FIG. 15 is a diagram illustrating a configuration of a semiconductor apparatus 1500 according to various embodiments. In FIG. 15, the semiconductor apparatus 1500 may include a clock receiver (RX) 1510, a clock division circuit 1511, a clock delay circuit 1520, a command receiver (RX) 1530, a command decoder 1540, a clock path 1550, a command path 1560, a mode register 1570, and a transmitter (TX) 1580. The clock receiver 1510 may receive an external clock signal CLKE transmitted by an external apparatus. The external clock signal CLKE may be transmitted as a single-ended signal, and may be transmitted as a differential signal along with a complementary signal CLKBE. In one embodiment, the clock receiver 1510 may generate a reference clock signal RCLK by differentially amplifying the external clock signal CLKE or CLKBE transmitted as a differential signal. In one embodiment, the clock receiver 1510 may generate the reference clock signal RCLK by differentially amplifying the external clock signal CLKE, transmitted as a single-ended signal, along with a reference voltage VREF. The reference voltage VREF may have a voltage level corresponding to the middle of a range in which the external clock signal CLKE swings. The external clock signal CLKE and/or the reference clock signal RCLK may correspond to the clock signal CLK illustrated in FIG. 1.

The clock division circuit 1511 may generate an even reference clock signal RCLK_EV and an odd reference clock signal RCLK_OD by dividing the reference clock signal RCLK. For example, the clock division circuit 1511 may generate the even reference clock signal RCLK_EV and odd reference clock signal RCLK_OD having a frequency corresponding to half of the frequency of the reference clock signal RCLK. The even reference clock signal RCLK_EV may be synchronized with an even-numbered edge of the reference clock signal RCLK. The odd reference clock signal RCLK_OD may be synchronized with an odd-numbered edge of the reference clock signal RCLK. A phase difference between the even reference clock signal RCLK_EV and the odd reference clock signal RCLK_OD may be 180 degrees.

The clock delay circuit 1520 may compensate for a delay quantity of the external clock signal CLKE attributable to an internal circuit of the semiconductor apparatus 1500. The clock delay circuit 1520 may generate a delay-locked clock signal, synchronized with the external clock signal CLKE, by delaying at least one of the even reference clock signal RCLK_EV and the odd reference clock signal RCLK_OD. The clock delay circuit 1520 may include a delay-locked loop circuit for generating the delay-locked clock signal by delaying at least one of the even reference clock signal RCLK_EV and the odd reference clock signal RCLK_OD. The clock delay circuit 1520 may generate a first division clock signal ICLK, a second division clock signal QCLK, a third division clock signal IBCLK and a fourth division clock signal QBCLK from the delay-locked clock signal. A phase difference between the first to fourth division clock signals ICLK, QCLK, IBCLK, and QBCLK may be 90 degrees. The second division clock signal QCLK and the fourth division clock signal QBCLK may correspond to the first division clock signal QCLK and second division clock signal QBCLK illustrated in FIG. 1, respectively. Although not illustrated, the clock delay circuit 1510 may further include a duty cycle correction circuit. The duty cycle correction circuit may correct the duty ratio of the first to fourth division clock signals ICLK, QCLK, IBCLK, and QBCLK so that the first to fourth division clock signals ICLK, QCLK, IBCLK, and QBCLK have a duty ratio of 50%.

The command receiver 1530 may receive a command signal CMD transmitted by the external apparatus. The command signal CMD may include a plurality of signals. The command signal CMD may include various types of information so that the semiconductor apparatus 1500 can perform various operations. The command signal CMD may include various types of information by a combination of logic levels of the plurality of signals.

The command decoder 1540 may receive the even reference clock signal RCLK_EV, the odd reference clock signal RCLK_OD, and the command signal CMD. The command decoder 1540 may latch the command signal CMD based on one of the even reference clock signal RCLK_EV and the odd reference clock signal RCLK_OD, and may generate various internal command signals ICMD by decoding the latched command signal. The internal command signals ICMD may include an even internal-command signal ICMD_EV and an odd internal-command signal ICMD_OD. When the command signal CMD is latched in synchronization with the even reference clock signal RCLK_EV, the command decoder 1540 may generate the even internal-command signal ICMD_EV. When the command signal CMD is latched in synchronization with the odd reference clock signal RCLK_OD, the command decoder 1540 may generate the odd internal-command signal ICMD_OD. The internal command signal ICMD may include a plurality of signals capable of setting the transmitter 1580 to have a termination resistance value. For example, the internal command signal ICMD may include a target write signal TWT, a non-target write signal NTWT, and a non-target read signal NTRD. The target write signal TWT may include an even target write signal and an odd target write signal. The non-target write signal NTWT may include an even non-target write signal and an odd non-target write signal. The non-target read signal NTRD may include an even non-target read signal and an odd non-target read signal.

The target write signal TWT may be an internal command signal ICMD generated based on the command signal CMD when the semiconductor apparatus 1500 performs a write operation. The non-target write signal NTWT may be an internal command signal ICMD generated based on the command signal CMD when another semiconductor apparatus electrically coupled to a system performs a write operation along with the semiconductor apparatus 1500. The non-target write signal NTWT may be generated when the semiconductor apparatus 1500 performs a non-target write operation. The semiconductor apparatus 1500 may provide termination resistance for the write operation of another semiconductor apparatus. The non-target read signal NTRD may be an internal command signal ICMD generated based on the command signal CMD when another semiconductor apparatus electrically coupled a system performs a read operation along with the semiconductor apparatus 1500. The non-target read signal NTRD may be generated when the semiconductor apparatus 1500 performs a non-target read operation. The semiconductor apparatus 1500 may provide termination resistance for the read operation of another semiconductor apparatus.

The clock path 1550 may include a clock tree 1551. The first to fourth division clock signals ICLK, QCLK, IBCLK, and QBCLK generated by the clock delay circuit 1520 may be output to the transmitter 1580 via the clock tree 1551.

The internal command signal ICMD generated by the command decoder 1540 may be output to the transmitter 1580 via the command path 1560. The command path 1560 may include a domain crossing circuit 1561 and an on die termination (ODT) tree 1562. The internal command signal ICMD is a signal asynchronously delayed without being synchronized with a clock signal. Accordingly, the domain crossing circuit 1561 may generate a synchronized internal command signal by synchronizing the internal command signal ICMD with the second or fourth division clock signal QCLK or QBCLK. The domain crossing circuit 1561 may synchronize the even internal-command signal ICMD_EV with the second division clock signal QCLK, and may synchronize the odd internal-command signal ICMD_OD with the fourth division clock signal QBCLK. The domain crossing circuit 1561 may generate a synchronized target write signal by synchronizing the target write signal TWT with the second or fourth division clock signal QCLK or QBCLK, and may define the pulse width of the synchronized target write signal. The domain crossing circuit 1561 may generate a synchronized non-target write signal by synchronizing the non-target write signal NTWT with the second or fourth division clock signal QCLK or QBCLK, and may define the pulse width of the synchronized non-target write signal. The domain crossing circuit 1561 may generate a synchronized non-target read signal by synchronizing the non-target read signal NTRD with the second or fourth division clock signal QCLK or QBCLK, and may define the pulse width of the synchronized non-target read signal. The domain crossing circuit 1561 may receive a plurality of resistance codes. The plurality of resistance codes may be provided by the mode register 1570.

The mode register 1570 may store various types of information related to an operation of the semiconductor apparatus 1500. The mode register 1570 may store a first resistance code RTT1<0:2>, a second resistance code RTT2<0:2>, a third resistance code RTT3<0:2>, and a fourth resistance code RTT4<0:2>. The first resistance code RTT1<0:2> may include information related to a termination resistance value which may be set when the semiconductor apparatus 1500 does not perform any operation. The second resistance code RTT2<0:2> may include information related to a termination resistance value which may be set when the semiconductor apparatus 1500 performs a write operation. The third resistance code RTT3<0:2> may include information related to a termination resistance value which may be set when the semiconductor apparatus 1500 performs a non-target write operation. The fourth resistance code RTT4<0:2> may include information related to a termination resistance value which may be set when the semiconductor apparatus 1500 performs a non-target read operation. The mode register 1570 may output the first to fourth resistance codes RTT1<0:2>, RTT2<0:2>, RTT3<0:2>, and RTT4<0:2> to the domain crossing circuit 1561. Each of the first to fourth resistance codes RTT1<0:2>, RTT2<0:2>, RTT3<0:2>, and RTT4<0:2> has been illustrated as including three bits, but various embodiments are not limited thereto. Each of the first to fourth resistance codes RTT1<0:2>, RTT2<0:2>, RTT3<0:2>, and RTT4<0:2> may include more or fewer than three bits in other embodiments.

The domain crossing circuit 1561 may output one of the first to fourth resistance codes RTT1<0:2>, RTT2<0:2>, RTT3<0:2>, and RTT4<0:2> as an ODT signal ODT<0:2> based on the target write signal TWT, the non-target write signal NTWT and the non-target read signal NTRD. For example, when the target write signal TWT is enabled, the domain crossing circuit 1561 may output the second resistance code RTT2<0:2> as the ODT signal ODT<0:2>. When the non-target write signal NTWT is enabled, the domain crossing circuit 1561 may output the third resistance code RTT3<0:2> as the ODT signal ODT<0:2>. When the non-target read signal NTRD is enabled, the domain crossing circuit 1561 may output the fourth resistance code RTT4<0:2> as the ODT signal ODT<0:2>. When any of the target write signal TWT, the non-target write signal NTWT, and the non-target read signal NTRD is not enabled, the domain crossing circuit 1561 may output the first resistance code RTT1<0:2> as the ODT signal ODT<0:2>. Furthermore, the domain crossing circuit 1561 may define priority between the target write signal TWT, the non-target write signal NTWT, and the non-target read signal NTRD. When at least two of the target write signal TWT, the non-target write signal NTWT, and the non-target read signal NTRD are enabled together, the domain crossing circuit 1561 may enable a resistance code, corresponding to a signal having priority, to be output. For example, the target write signal TWT may have priority over the non-target write signal NTWT and the non-target read signal NTRD. The non-target write signal NTWT may have priority over the non-target read signal NTRD. When the target write signal TWT and at least one of the non-target write signal NTWT and the non-target read signal NTRD are enabled together, the domain crossing circuit 1561 may output the second resistance code RTT2<0:2> as the ODT signal ODT<0:2> based on the target write signal TWT having priority. The ODT signal ODT<0:2> may be delayed through the ODT tree 1562 and generated as a termination enable signal ODTEN<0:2>.

When the termination enable signal ODTEN<0:2> is received, the transmitter 1580 may be set to have a termination resistance value. The transmitter 1580 may include a plurality of resistance legs. The plurality of resistance legs may be set to have a given resistance value through the execution of a calibration operation, such as ZQ calibration. The termination enable signal ODTEN<0:2> may be set to determine the number of resistance legs that are turned on among the plurality of resistance legs so that the transmitter 1580 has a termination resistance value. In one embodiment, the transmitter 1580 may include a decoding circuit. The decoding circuit may decode the termination enable signal ODTEN<0:2>. The transmitter 1580 may include the decoding circuit so that a large number of resistance legs can be selected based on the termination enable signal ODTEN<0:2> having a small number of bits. The transmitter 1580 may output, to an external apparatus, a signal output by the clock tree 1551. The transmitter 1580 may output, to the external apparatus, the signal output by the clock tree 1551 as a data strobe signal DQS. The data strobe signal DQS may be output to the external apparatus in synchronization with data output by the semiconductor apparatus 1500. The data strobe signal DQS may be transmitted to the external apparatus through a bus.

A delay quantity attributable to the clock path 1550 may be easily reduced in a design aspect. In contrast, it is difficult to reduce a delay quantity attributable to the command path 1560 because the domain crossing circuit 1561 has to convert the internal command signal ICMD into a signal synchronized with a clock signal. Accordingly, a mismatch may occur between the time taken for the division clock signals ICLK, QCLK, IBCLK, or QBCLK to reach the transmitter 1580 through the clock path 1550 and the time taken for the internal command signal ICMD to reach the transmitter 1580 as the termination enable signal ODTEN<0:2> through the command path 1560. Furthermore, the domain crossing circuit 1561 needs to generate the termination enable signal ODTEN<0:2> having a given pulse width for the operation reliability of the semiconductor apparatus 1500. Accordingly, the domain crossing circuit 1561 may include the signal generation circuit 100 or 1400 illustrated in FIG. 1 or 14. In this case, the termination enable signal ODTEN<0:2> needs to be enabled before the semiconductor apparatus 1500 performs the target write operation, the non-target write operation and the non-target read operation, and needs to be disabled after the semiconductor apparatus 1500 completes the target write operation, the non-target write operation and the non-target read operation. For example, the termination enable signal ODTEN<0:2> may be enabled, by a time corresponding to two cycles of the external clock signal CLKE and/or the reference clock signal RCLK, earlier than timing in which the transmitter 1580 transmits the data strobe signal DQS. The ODT signal ODTEN may be disabled after a time corresponding to 1 cycle, 1.5 cycles, or 2 cycles of the external clock signal CLKE and/or the reference clock signal RCLK after the semiconductor apparatus 1500 completes the target write operation, the non-target write operation, and the non-target read operation. Accordingly, the pulse width control circuit 500 illustrated in FIG. 5 may be modified as illustrated in FIG. 16.

Figure 16:
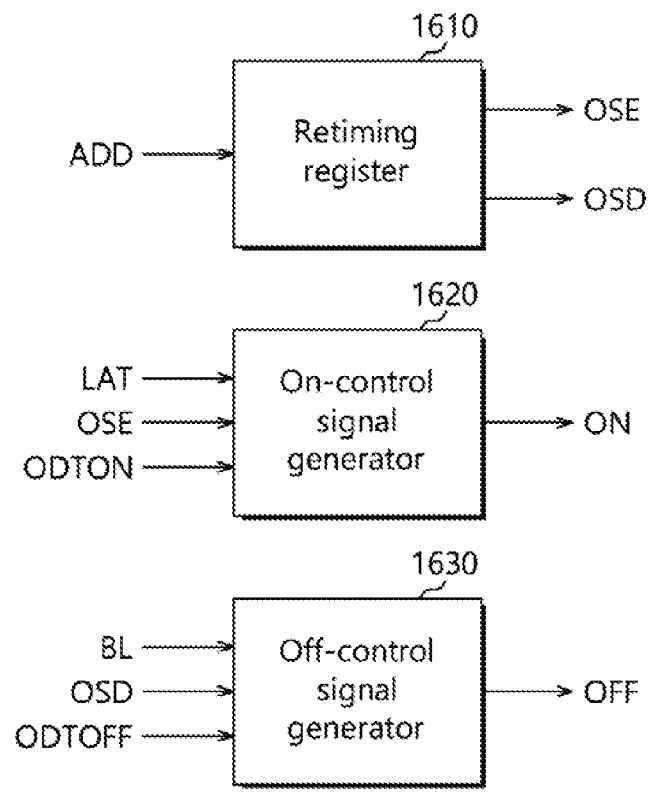
FIG. 16 is a diagram illustrating a configuration of a pulse width control circuit according to various embodiments.

FIG. 16 is a diagram illustrating a configuration of a pulse width control circuit 1600 according to various embodiments. Referring to FIG. 16, the pulse width control circuit 1600 may include a retiming register 1610, an on-control signal generator 1620 and an off-control signal generator 1630. The retiming register 1610 may be the same as the retiming register 510 illustrated in FIG. 5, and a redundant description thereof is omitted.

The on-control signal generator 1620 may receive the operation latency LAT, the on-offset signal OSE and an on-margin signal ODTON, and may generate the on-control signal ON. The on-margin signal ODTON may include information corresponding to a time margin in which the ODT signal ODTEN needs to be enabled prior to timing in which the transmitter 1580 outputs the data strobe signal DQS. The operation latency LAT, the on-offset signal OSE and the on-margin signal ODTON may be provided by the mode register 1570 illustrated in FIG. 15. The on-control signal generator 1620 may generate the on-control signal ON by performing an operation on the operation latency LAT, the on-offset signal OSE and the on-margin signal ODTON. For example, the on-control signal generator 1620 may generate the on-control signal ON by subtracting the on-offset signal OSE and the on-margin signal ODTON from the operation latency LAT. For example, when the operation latency LAT corresponds to 10, the on-offset signal OSE corresponds to 2, and the on-margin signal ODTON corresponds to 2, the on-control signal ON may correspond to 6. The first on-timing control circuit 211 illustrated in FIG. 2 may generate the even on-pulse signal ONA by delaying the first input signal INA by six cycles of the external clock signal CLKE and/or the reference clock signal RCLK (i.e., by three cycles of the second division clock signal QCLK) in response to the on-control signal ON.

The off-control signal generator 1630 may receive the operation section information BL, the off-offset signal OSD and an off-margin signal ODTOFF, and may generate the off-control signal OFF. The off-margin signal ODTOFF may include information corresponding to a time margin in which the ODT signal ODTEN needs to be disabled after the transmitter 1580 completes the transmission of the data strobe signal DQS. The operation section information BL, the off-offset signal OSD and the off-margin signal ODTOFF may be provided by the mode register 1570 illustrated in FIG. 15. The off-control signal generator 1630 may generate the off-control signal OFF by performing an operation on the operation section information BL, the off-offset signal OSD and the off-margin signal ODTOFF. For example, the off-control signal generator 1630 may generate the off-control signal OFF by subtracting the off-offset signal OSD from the operation section information BL and adding the off-margin signal ODTOFF to a subtraction result. For example, when the operation section information BL corresponds to 16, the off-offset signal OSD corresponds to 2, and the off-margin signal ODTOFF corresponds to 2, the off-control signal OFF may correspond to 16. The first off-timing control circuit 212 illustrated in FIG. 2 may generate the even off-pulse signal OFFA by delaying the even on-pulse signal ONA by 16 cycles of the external clock signal CLKE and/or the reference clock signal RCLK (i.e., by 8 cycles of the first division clock signal QCLK) in response to the off-control signal OFF.

Figure 17:
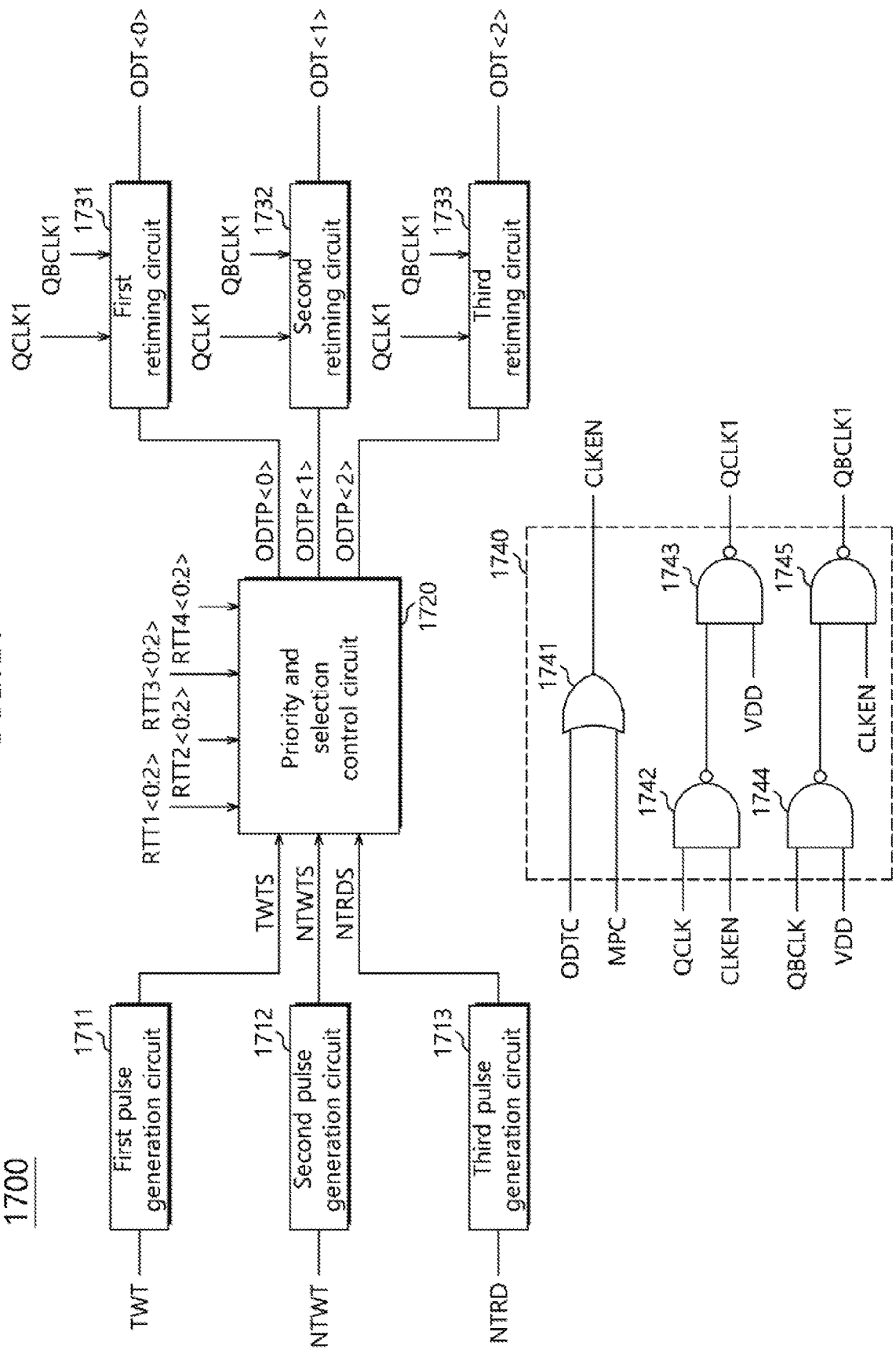
FIG. 17 is a diagram illustrating a configuration of a domain crossing circuit according to various embodiments.

FIG. 17 is a diagram illustrating a configuration of a domain crossing circuit 1700 according to various embodiments. The domain crossing circuit 1700 may be applied as the domain crossing circuit 1561 illustrated in FIG. 15. Referring to FIG. 17, the domain crossing circuit 1700 may include a first pulse generation circuit 1711, a second pulse generation circuit 1712, a third pulse generation circuit 1713, a priority and selection control circuit 1720, a first retiming circuit 1731, a second retiming circuit 1732, and a third retiming circuit 1733. Each of the first to third pulse generation circuits 1711, 1712, and 1713 may be an element, including the first synchronization signal generation circuit 110, the second synchronization signal generation circuit 120, and the gating circuit 140 illustrated in FIG. 1 and the pulse width control circuit 1600 illustrated in FIG. 16. The first pulse generation circuit 1711 may receive the target write signal TWT and generate a synchronized target write signal TWTS. The second pulse generation circuit 1712 may receive the non-target write signal NTWT and generate a synchronized non-target write signal NTWTS. The third pulse generation circuit 1713 may receive the non-target read signal NTRD and generate a synchronized non-target read signal NTRDS. At least some of the synchronized target write signal TWTS, the synchronized non-target write signal NTWTS and the synchronized non-target read signal NTRDS may have the same pulse width. In one embodiment, the synchronized target write signal TWTS, the synchronized non-target write signal NTWTS and the synchronized non-target read signal NTRDS may have different pulse widths.

The priority and selection control circuit 1720 may receive the synchronized target write signal TWTS, the synchronized non-target write signal NTWTS and the synchronized non-target read signal NTRDS, and may receive the first to fourth resistance codes RTT1<0:2>, RTT2<0:2>, RTT3<0:2>, and RTT4<0:2> from the mode register 1570 illustrated in FIG. 15. The priority and selection control circuit 1720 may select only any one of the synchronized target write signal TWTS, the synchronized non-target write signal NTWTS and the synchronized non-target read signal NTRDS based on priority in the state in which at least two of the synchronized target write signal TWTS, the synchronized non-target write signal NTWTS and the synchronized non-target read signal NTRDS have been enabled together. When the synchronized target write signal TWTS is enabled, the priority and selection control circuit 1720 may output the second resistance code RTT2<0:2> as a preliminary ODT signal ODTP<0:2> in the section in which the synchronized target write signal TWTS has been enabled. When the synchronized non-target write signal NTWTS is enabled, the priority and selection control circuit 1720 may output the third resistance code RTT3<0:2> as the preliminary ODT signal ODTP<0:2> in the section in which the synchronized non-target write signal NTWTS has been enabled. When the synchronized non-target read signal NTRDS is enabled, the priority and selection control circuit 1720 may output the fourth resistance code RTT4<0:2> as the preliminary ODT signal ODTP<0:2> in the section in which the synchronized non-target read signal NTRDS has been enabled. The priority and selection control circuit 1720 may output the first resistance code RTT1<0:2> as the preliminary ODT signal ODTP<0:2> in the state in which all the synchronized target write signal TWTS, the synchronized non-target write signal NTWT and the synchronized non-target read signal NTRD have been disabled. For example, a case where after the synchronized non-target write signal NTWTS is enabled, the synchronized target write signal TWTS is enabled is assumed. The priority and selection control circuit 1720 may output the first resistance code RTT1<0:2> as the preliminary ODT signal ODTP<0:2>, may stop the output of the first resistance code RTT1<0:2> when the synchronized non-target write signal NTWTS is enabled, and may output the third resistance code RTT3<0:2> as the preliminary ODT signal ODTP<0:2>. Thereafter, when the synchronized target write signal TWTS is enabled, the priority and selection control circuit 1720 may stop the output of the third resistance code RTT3<0:2> and output the second resistance code RTT2<0:2> as the preliminary ODT signal ODTP<0:2>. When the synchronized target write signal TWTS is disabled, the priority and selection control circuit 1720 may stop the output of the second resistance code RTT2<0:2> and output the first resistance code RTT1<0:2> as the preliminary ODT signal ODTP<0:2>.

Each of the first to third retiming circuits 1731, 1732, and 1733 may include any one of the retiming circuits 800, 900, and 1000 illustrated in FIGS. 8 to 10. The first to third retiming circuits 1731, 1732, and 1733 may receive a first gating clock signal QCLK1 and a second gating clock signal QBCLK1. The first gating clock signal QCLK1 may be substituted with the first division clock signal QCLK input to the retiming circuit 800, 900, or 1000. The second gating clock signal QBCLK1 may be substituted with the second division clock signal QBCLK input to the retiming circuit 800, 900, or 1000. The first gating clock signal QCLK1 may have substantially the same phase and frequency as the second division clock signal QCLK illustrated in FIG. 15. The second gating clock signal QBCLK1 may have substantially the same phase and frequency as the fourth division clock signal QBCLK illustrated in FIG. 15. The first retiming circuit 1731 may generate the ODT signal ODT<0> by retiming the preliminary ODT signal ODTP<0> based on the first and second gating clock signals QCLK1 and QBCLK1. The second retiming circuit 1732 may generate the ODT signal ODT<1> by retiming the preliminary ODT signal ODTP<1> based on the first and second gating clock signals QCLK1 and QBCLK1. The third retiming circuit 1733 may generate the ODT signal ODT<2> by retiming the preliminary ODT signal ODTP<2> based on the first and second gating clock signals QCLK1 and QBCLK1. The priority and selection control circuit 1720 may include many logic gating elements because it has to output one of the first to fourth resistance codes RTT1<0:2>, RTT2<0:2>, RTT3<0:2>, and RTT4<0:2> by determining priority of the target write signal TWT, the non-target write signal NTWT and the non-target read signal NTRD. A delay may occur in a circuit, including many logic gating elements, depending on a process variation and degradation. Furthermore, an asynchronized delay may occur in the priority and selection control circuit 1720 because it does not operate in synchronization with a clock signal. In various embodiments, the first to third retiming circuits 1731, 1732, and 1733 have a structure of retiming a signal output by the priority and selection control circuit 1720. Accordingly, the first to third retiming circuits 1731, 1732, and 1733 may output the ODT signal ODT<0:2> by compensating for a changed pulse width or phase of the preliminary ODT signal ODTP<0:2> attributable to the priority and selection control circuit 1720.

The domain crossing circuit 1700 may further include a clock gating circuit 1740. The clock gating circuit 1740 may generate a clock enable signal CLKEN based on an on-die termination command signal ODTC. The clock gating circuit 1740 may enable the clock enable signal CLKEN when the on-die termination command signal ODTC is enabled. The on-die termination command signal ODTC may be a signal enabled when any one of the target write signal TWT, the non-target write signal NTWT, and the non-target read signal NTRD is enabled. The clock gating circuit 1740 may further receive a multi-purpose command signal MPC, and may generate the clock enable signal CLKEN based on the on-die termination command signal ODTC and the multi-purpose command signal MPC. The clock gating circuit 1740 may enable the clock enable signal CLKEN when at least one of the on-die termination command signal ODTC and the multi-purpose command signal MPC is enabled. The multi-purpose command signal MPC may be one of the internal command signals ICMD illustrated in FIG. 15, and may be generated from a command signal CMD which may be input to change a value of the first resistance code RTT1<0:2>. When the multi-purpose command signal MPC is received, the clock gating circuit 1740 may enable the clock enable signal CLKEN so that the ODT signal ODT<0:2> is output based on the changed first resistance code RTT1<0:2>. Accordingly, a logic value of the ODT signal ODT<0:2> may be updated from a first resistance code RTT<0:2> prior to a change to a first resistance code RTT1<0:2> after a change.

The clock gating circuit 1740 may output the second division clock signal QCLK as the first gating clock signal QCLK1 and output the fourth division clock signal QBCLK as the second gating clock signal QBCLK1, based on the clock enable signal CLKEN. When the clock enable signal CLKEN is enabled, the clock gating circuit 1740 may output the second division clock signal QCLK as the first gating clock signal QCLK1 and output the fourth division clock signal QBCLK as the second gating clock signal QBCLK1.

The clock gating circuit 1740 may include an OR gate 1741, a first NAND gate 1742, a second NAND gate 1743, a third NAND gate 1744, and a fourth NAND gate 1745. The OR gate 1741 may receive the on-die termination command signal ODTC and the multi-purpose command signal MPC, and may output the clock enable signal CLKEN. The first NAND gate 1742 may receive the second division clock signal QCLK and the clock enable signal CLKEN. The second NAND gate 1743 may receive the output of the first NAND gate 1742 and a power supply voltage VDD and output the first gating clock signal QCLK1. The power supply voltage VDD may have a voltage level which may be determined as a logic high level. The third NAND gate 1744 may receive the fourth division clock signal QBCLK and the power supply voltage VDD. The fourth NAND gate 1745 may receive the output of the third NAND gate 1744 and the clock enable signal CLKEN, and may output the second gating clock signal QBCLK1.

While various embodiments have been described above, it will be understood to those skilled in the art that the embodiments described are by way of example only. Accordingly, the apparatus and method described herein should not be limited based on the described embodiments.

What is claimed is:

1. A signal generation circuit comprising:
   a clock division circuit configured to divide a clock signal to generate a first division clock signal and a second division clock signal;
   a first synchronization signal generation circuit configured to delay a first input signal in synchronization with the first division clock signal to generate a first synchronization signal and configured to adjust a pulse width of the first synchronization signal based on an on-control signal and an off-control signal;
   a second synchronization signal generation circuit configured to delay a second input signal in synchronization with the second division clock signal to generate a second synchronization signal and configured to adjust a pulse width of the second synchronization signal based on the on-control signal and the off-control signal; and
   a retiming circuit configured to generate an output signal by retiming a preliminary output signal based on the first and second division clock signals, wherein the preliminary output signal is generated from at least one of the first and second synchronization signals.

2. The signal generation circuit according to claim 1, wherein the first division clock signal and the second division clock signal have a phase difference of 180 degrees.

3. The signal generation circuit according to claim 1, wherein the first synchronization signal generation circuit is configured to:

generate an even on-pulse signal by delaying the first input signal by n cycles of the first division clock signal, wherein n represents a natural number;

determine enabling timing of the first synchronization signal based on the even on-pulse signal, wherein n is determined based on the on-control signal;

generate an even off-pulse signal by delaying the even on-pulse signal by m cycles of the first division clock signal, wherein m represents a natural number; and determine disabling timing of the first synchronization signal based on the even off-pulse signal, wherein m is determined based on the off-control signal.

4. The signal generation circuit according to claim 1, wherein the first synchronization signal generation circuit comprises:

a first on-timing control circuit configured to generate an even on-pulse signal by delaying the first input signal by n cycles of the first division clock signal, wherein n represents a natural number, and wherein n is determined based on the on-control signal;

a first off-timing control circuit configured to generate m even off-pulse signals by delaying the even on-pulse signal by m cycles of the first division clock signal, wherein m represents a natural number, and wherein m is determined based on the off-control signal; and a first pulse summer configured to generate the first synchronization signal by adding the even on-pulse signal and m even off-pulse signals.

5. The signal generation circuit according to claim 1, wherein the second synchronization signal generation circuit is configured to:

generate an odd on-pulse signal by delaying the second input signal by n cycles of the second division clock signal, wherein n represents a natural number;

determine enabling timing of the second synchronization signal based on the odd on-pulse signal, wherein n is determined based on the on-control signal;

generate an odd off-pulse signal by delaying the odd on-pulse signal by m cycles of the second division clock signal, wherein m represents a natural number; and determine disabling timing of the second synchronization signal based on the odd off-pulse signal, wherein m is determined based on the off-control signal.

6. The signal generation circuit according to claim 1, wherein the second synchronization signal generation circuit comprises:

a second on-timing control circuit configured to generate an odd on-pulse signal by delaying the second input signal by n cycles of the second division clock signal, wherein n represents a natural number, and wherein n is determined based on the on-control signal;

a second off-timing control circuit configured to generate m odd off-pulse signals by delaying the odd on-pulse signal by m cycles of the second division clock signal, wherein m represents a natural number, and wherein m is determined based on the off-control signal; and a second pulse summer configured to generate the second synchronization signal by adding the even on-pulse signal and the m odd off-pulse signals.

7. The signal generation circuit according to claim 1, wherein the retiming circuit comprises:

a first flip-flop configured to output the preliminary output signal in synchronization with the first division clock signal;

a second flip-flop configured to output the preliminary output signal in synchronization with the second division clock signal; and a logic gate configured to generate the output signal by gating the outputs of the first and second flip-flops.

8. The signal generation circuit according to claim 7, wherein the logic gate comprises one of an AND gate and the OR gate.

9. The signal generation circuit according to claim 1, wherein the retiming circuit comprises:

a first flip-flop configured to output the preliminary output signal in synchronization with a first delay clock signal;

a second flip-flop configured to output the preliminary output signal in synchronization with a second delay clock signal;

a first logic gate configured to gate the outputs of the first and second flip-flops;

a third flip-flop configured to output an output of the first logic gate in synchronization with the first division clock signal;

a fourth flip-flop configured to output an output of the first logic gate in synchronization with the second division clock signal; and a second logic gate configured to generate the output signal by gating the outputs of the third and fourth flip-flops, wherein the first delay clock signal is generated by delaying the first division clock signal for an interval of time, and wherein the second delay clock signal is generated by delaying the second division clock signal for the interval of time.

10. The signal generation circuit according to claim 9, wherein:

the first logic gate comprises one of an AND gate and an OR gate; and the second logic gate comprises one of an AND gate and an OR gate.

11. The signal generation circuit according to claim 1, wherein the retiming circuit comprises:

a first flip-flop configured to output the preliminary output signal in synchronization with a first delay clock signal;

a second flip-flop configured to output the preliminary output signal in synchronization with a second delay clock signal;

a third flip-flop configured to output the output of the first flip-flop in synchronization with the first division clock signal;

a fourth flip-flop configured to output the output of the second flip-flop in synchronization with the second division clock signal; and a logic gate configured to generate the output signal by gating the outputs of the third and fourth flip-flops, wherein the first delay clock signal is generated by delaying the first division clock signal for an interval of time, and wherein the second delay clock signal is generated by delaying the second division clock signal for the interval time.

12. The signal generation circuit according to claim 11, wherein the logic gate comprises one of an AND gate and an OR gate.

13. The signal generation circuit according to claim 1, further comprising a pulse width control circuit configured to generate the on-control signal and the off-control signal based on operation latency, operation section information, and retiming latency.

14. The signal generation circuit according to claim 13, wherein the retiming latency is set based on a delay quantity occurring in the retiming circuit.

15. The signal generation circuit according to claim 13, wherein the pulse width control circuit comprises:
- a retiming register configured to output an on-offset signal and off-offset signal corresponding to the retiming latency based on an address signal;
- an on-control signal generator configured to generate the on-control signal by computing the operation latency and the on-offset signal; and
- an off-control signal generator configured to generate the off-control signal by computing the operation section information and the off-offset signal.

16. The signal generation circuit according to claim 13, wherein:
- the retiming circuit comprises at least one programmable retiming module configured to generate the output signal by retiming the preliminary output signal based on the first and second division clock signals; and
- retiming latency of the at least one programmable retiming module is determined based on a mode signal and a bypass signal.

17. The signal generation circuit according to claim 16, wherein the at least one programmable retiming module comprises a first input terminal, a second input terminal, a first output terminal, and a second output terminal, and further comprises:
- a first flip-flop configured to output an output by synchronizing a signal, received through the first input terminal, with the first division clock signal;
- a second flip-flop configured to output an output by synchronizing a signal, received through the second input terminal, with the second division clock signal;
- an AND gate configured to output an output by AND-gating the output of the first flip-flop and the output of the second flip-flop;
- an OR gate configured to output an output by OR-gating the output of the first flip-flop and the output of the second flip-flop;
- a first multiplexer configured to output one of the output of the AND gate and the output of the OR gate based on the mode signal;
- a second multiplexer configured to output one of the output of the first flip-flop and the output of the first multiplexer to a first output terminal based on the bypass signal; and
- a third multiplexer configured to output one of the output of the second flip-flop and the output of the first multiplexer to a second output terminal based on the bypass signal.

18. The signal generation circuit according to claim 16, wherein the pulse width control circuit is further configured to generate the mode signal and the bypass signal based on the address signal.

19. A signal generation circuit comprising:
- a clock divider configured to divide a clock signal to generate a first division clock signal and a second division clock signal;
- an on-pulse generation circuit configured to delay a first input signal based on the first division clock signal and an on-control signal to generate an even on-pulse signal and configured to delay a second input signal based on the second division clock signal and the on-control signal to generate an odd on-pulse signal;
- an off-pulse generation circuit configured to delay one of the even on-pulse signal and the odd on-pulse signal based on the first division clock signal and an off-control signal to generate a plurality of even off-pulse signals and configured to delay one of the even on-pulse signal and the odd on-pulse signal based on the second division clock signal and the off-control signal to generate a plurality of odd off-pulse signals;
- a pulse sum circuit configured to combine one of the even on-pulse signal and the odd on-pulse signal with the plurality of even off-pulse signals to generate a first synchronization signal and configured to combine one of the even on-pulse signal and the odd on-pulse signal with the plurality of odd off-pulse signals to generate a second synchronization signal; and
- a retiming circuit configured to generate an output signal by retiming a preliminary output signal based on the first and second division clock signals, generated from one of the first and second synchronization signals.

20. The signal generation circuit according to claim 19, wherein:
- the first input signal is generated from a signal received in synchronization with an odd-numbered edge of the clock signal; and
- the second input signal is generated from a signal received in synchronization with an even-numbered edge of the clock signal.

21. The signal generation circuit according to claim 19, wherein the first division clock signal and the second division clock signal have a phase difference of 180 degrees.

22. The signal generation circuit according to claim 19, wherein:
- the first division clock signal is generated in synchronization with an odd-numbered falling edge of the clock signal; and
- the second division clock signal is generated in synchronization with an even-numbered falling edge of the clock signal.

23. The signal generation circuit according to claim 19, wherein the on-pulse generation circuit comprises:
- a first on-timing control circuit configured to generate the even on-pulse signal by delaying the first input signal by n cycles of the first division clock signal, wherein n represents a natural number, and wherein n is determined based on the on-control signal; and
- a second on-timing control circuit configured to generate the odd on-pulse signal by delaying the second input signal by n cycles of the second division clock signal.

24. The signal generation circuit according to claim 23, wherein the off-pulse generation circuit comprises:
- a first off-timing control circuit configured to generate m even off-pulse signals by delaying one of the even on-pulse signal and the odd on-pulse signal by m cycles of the first division clock signal, wherein m represents a natural number, and wherein m is determined based on the off-control signal; and
- a second off-timing control circuit configured to generate m odd off-pulse signals by delaying one of the even on-pulse signal and the odd on-pulse signal by m cycles of the second division clock signal.

25. The signal generation circuit according to claim 24, further comprising a switching circuit configured to, based on the on-control signal, output the even on-pulse signal to one of the first and second off-timing control circuits and to output the odd on-pulse signal to one of the first and second off-timing control circuits.

26. The signal generation circuit according to claim 19, wherein the pulse sum circuit comprises:

a first pulse summer configured to generate the first synchronization signal by adding one of the even on-pulse signal and the odd on-pulse signal with the plurality of even off-pulse signals; and a second pulse summer configured to generate the second synchronization signal by adding one of the even on-pulse signal and the odd on-pulse signal with the plurality of odd off-pulse signals.

27. The signal generation circuit according to claim 19, wherein the retiming circuit comprises:

a first flip-flop configured to output the preliminary output signal in synchronization with the first division clock signal;

a second flip-flop configured to output the preliminary output signal in synchronization with the second division clock signal; and a logic gate configured to generate the output signal by gating the outputs of the first and second flip-flops.

28. The signal generation circuit according to claim 27, wherein the logic gate comprises one of an AND gate and an OR gate.

29. The signal generation circuit according to claim 19, wherein the retiming circuit comprises:

a first flip-flop configured to output the preliminary output signal in synchronization with a first delay clock signal;

a second flip-flop configured to output the preliminary output signal in synchronization with a second delay clock signal;

a first logic gate configured to gate the outputs of the first and second flip-flops;

a third flip-flop configured to output an output of the first logic gate in synchronization with the first division clock signal;

a fourth flip-flop configured to output an output of the first logic gate in synchronization with the second division clock signal; and a second logic gate configured to generate the output signal by gating the outputs of the third and fourth flip-flops, wherein the first delay clock signal is generated by delaying the first division clock signal for an interval of time, and wherein the second delay clock signal is generated by delaying the second division clock signal for the interval of time.

30. The signal generation circuit according to claim 29, wherein:

the first logic gate comprises one of an AND gate and an OR gate; and the second logic gate comprises one of an AND gate and an OR gate.

31. The signal generation circuit according to claim 19, wherein the retiming circuit comprises:

a first flip-flop configured to output the preliminary output signal in synchronization with a first delay clock signal;

a second flip-flop configured to output the preliminary output signal in synchronization with a second delay clock signal;

a third flip-flop configured to output the output of the first flip-flop in synchronization with the first division clock signal;

a fourth flip-flop configured to output the output of the second flip-flop in synchronization with the second division clock signal; and a logic gate configured to generate the output signal by gating the outputs of the third and fourth flip-flops, wherein the first delay clock signal is generated by delaying the first division clock signal for an interval of time, and wherein the second delay clock signal is generated by delaying the second division clock signal for the interval of time.

32. The signal generation circuit according to claim 19, further comprising a pulse width control circuit configured to generate the on-control signal and the off-control signal based on operation latency, operation section information, and retiming latency.

33. The signal generation circuit according to claim 32, wherein the pulse width control circuit comprises:

a retiming register configured to output an on-offset signal and off-offset signal corresponding to the retiming latency based on an address signal, wherein the retiming latency is determined based on a delay quantity of the retiming circuit;

an on-control signal generator configured to generate the on-control signal by computing the operation latency and the on-offset signal; and an off-control signal generator configured to generate the off-control signal by computing the operation section information and the off-offset signal.

* * * * *